United States Patent [19]
Braithwaite

[11] Patent Number: 6,133,789
[45] Date of Patent: *Oct. 17, 2000

[54] METHOD AND SYSTEM FOR ROBUSTLY LINEARIZING A RADIO FREQUENCY POWER AMPLIFIER USING VECTOR FEEDBACK

[75] Inventor: Richard Neil Braithwaite, Calgary, Canada

[73] Assignee: Nortel Networks Corporation, Montreal, Canada

[*] Notice: This patent issued on a continued prosecution application filed under 37 CFR 1.53(d), and is subject to the twenty year patent term provisions of 35 U.S.C. 154(a)(2).

[21] Appl. No.: 08/987,843

[22] Filed: Dec. 10, 1997

[51] Int. Cl.$^7$ ........................................................ H03F 1/32
[52] U.S. Cl. .............................................. 330/149; 330/280
[58] Field of Search ..................................... 330/149, 136, 330/129, 280, 151, 52

[56] References Cited

U.S. PATENT DOCUMENTS

| | | |
|---|---|---|
| 3,699,444 | 10/1972 | Ghose et al. ............................... 325/21 |
| 3,900,823 | 8/1975 | Sokal et al. ............................... 330/149 |
| 3,922,617 | 11/1975 | Denniston et al. ...................... 330/149 |
| 4,329,655 | 5/1982 | Nojima et al. ........................... 330/149 |
| 4,389,618 | 6/1983 | Bauman .................................... 330/149 |
| 4,394,624 | 7/1983 | Bauman .................................... 330/151 |
| 4,412,185 | 10/1983 | Gerard ..................................... 330/149 |
| 4,560,945 | 12/1985 | Olver ....................................... 330/149 |
| 4,580,105 | 4/1986 | Myer ........................................ 330/149 |
| 4,879,519 | 11/1989 | Myer ........................................ 330/149 |
| 4,885,551 | 12/1989 | Myer ........................................ 330/52 |
| 4,926,134 | 5/1990 | Olver ........................................ 330/2 |
| 5,023,565 | 6/1991 | Lieu ......................................... 330/151 |
| 5,051,704 | 9/1991 | Chapman et al. ........................ 330/52 |
| 5,075,635 | 12/1991 | Boulanger et al. ...................... 330/149 |
| 5,121,077 | 6/1992 | McGann .................................. 330/149 |
| 5,124,665 | 6/1992 | McGann .................................. 330/149 |
| 5,126,687 | 6/1992 | Onoda et al. ............................ 330/149 |
| 5,148,117 | 9/1992 | Talwar ..................................... 330/151 |
| 5,155,448 | 10/1992 | Powell ..................................... 330/149 |
| 5,157,345 | 10/1992 | Kenington et al. ..................... 330/149 |
| 5,157,346 | 10/1992 | Powell et al. ........................... 330/151 |
| 5,166,634 | 11/1992 | Narahashi et al. ...................... 330/151 |
| 5,291,209 | 3/1994 | Evans et al. ............................. 342/381 |
| 5,323,119 | 6/1994 | Powell et al. ........................... 330/151 |
| 5,489,875 | 2/1996 | Cavers .................................... 330/151 |
| 5,491,454 | 2/1996 | Matz ....................................... 330/149 |
| 5,495,502 | 2/1996 | Andersen ................................ 375/235 |
| 5,617,061 | 4/1997 | Fukuchi .................................. 330/151 |
| 5,760,646 | 6/1998 | Belcher et al. ......................... 330/149 |
| 5,768,699 | 6/1998 | Behan et al. ........................... 330/151 |
| 5,789,976 | 8/1998 | Ghannouchi et al. .................. 330/52 |

*Primary Examiner*—Robert Pascal
*Assistant Examiner*—Khanh Van Nguyen

[57] ABSTRACT

A method of linearizing an amplifier having an input and an output involves the steps of amplifying the amplifier input signal with a vector modulator having a gain adjustment signal input for receiving a gain adjustment signal and adjusting the gain of the vector modulator in response to a gain adjustment signal to produce an amplifier output signal at the amplifier output. This is followed by producing a gain error signal dependent upon the amplifier input signal and the amplifier output signal, the gain error signal having real and imaginary components lying within pre-defined regions in a complex plane. Finally, the gain adjustment signal is generated in response to a region in the complex plane in which an error signal vector defined by the real an imaginary components of the error signal vector lies.

28 Claims, 17 Drawing Sheets

| IF | THEN |
|---|---|
| $|\text{Re}\{c_X\}| < 0.5$ and $|\text{Im}\{c_X\}| < 0.5$ | $\delta g = c_X$ |
| $\text{Re}\{c_X\} \geq 0.5$ and $|\text{Im}\{c_X\}| \geq 0.5$ | $\delta g = \alpha \cdot c_X$ where $\alpha = \min[0.5/|\text{Re}\{c_X\}|, 0.5/|\text{Im}\{c_X\}|, 1]$ |
| $\text{Re}\{c_X\} < -0.5$ and $\text{Im}\{c_X\} > 0.0$ | $\text{Re}\{\delta g\} = \alpha \cdot \text{Re}\{c_X\}, \text{Im}\{\delta g\} = \alpha \cdot \text{Im}\{c_X\} + B\phi$ where $\alpha = \min[0.5/|\text{Re}\{c_X\}|, 0.5/|\text{Im}\{c_X\}|, 1]$ |
| $\text{Re}\{c_X\} > 0.5$ | $\delta g = \alpha \cdot c_X$ where $\alpha = \min[0.5/|\text{Re}\{c_X\}|, 0.5/|\text{Im}\{c_X\}|, 1]$ |
| $\text{Re}\{c_X\} < -0.5$ and $\text{Im}\{c_X\} < 0.0$ | $\text{Re}\{\delta g\} = \alpha \cdot \text{Re}\{c_X\}, \text{Im}\{\delta g\} = \alpha \cdot \text{Im}\{c_X\} - B\phi$ where $\alpha = \min[0.5/|\text{Re}\{c_X\}|, 0.5/|\text{Im}\{c_X\}|, 1]$ |

FIG. 6

METHOD AND SYSTEM FOR ROBUSTLY LINEARIZING A RADIO FREQUENCY POWER AMPLIFIER USING VECTOR FEEDBACK

FIELD OF THE INVENTION

The present invention relates to a robust vector feedback system. More particularly, it relates to the use of this system to linearize the response of a radio frequency power amplifier.

BACKGROUND OF THE INVENTION

A radio frequency (RF) power amplifier is the last amplification stage in a radio transmitter. It is a particularly non-linear amplifier. In other words, a power amplifier's complex gain is not constant for all input power levels.

This non-linearity is problematic. For an RF signal with an AM component, non-linear amplification introduces intermodulation distortion (IMD), which is strictly limited by government regulation. In fact, IMD regulation forces many power amplifiers to be operated at low power, low efficiency levels. Clearly it is undesirable to limit amplifier output power if other methods exist for reducing IMD.

One method is to actively linearize the response of the amplification path as a whole to compensate for non-linearity in the power amplifier. A complex error signal is calculated by comparing the amplification path's output signal to its input signal. A compensating signal is then generated from the error signal. In adaptive feedforward compensation, the compensating signal is added to the amplification path's output signal. In adaptive predistortion, the compensating signal adjusts a non-linear device placed in series ahead of the power amplifier. In vector feedback linearization, the compensating signal adjusts the complex gain of a vector modulator in the amplification path, maintaining a constant amplification path gain even while the gain of the power amplifier varies. The present invention relates to this last method, vector feedback linearization.

Conventional vector feedback linearization systems suffer from a number of disadvantages.

First, they are sensitive to power variations in the input signal. It is difficult to achieve both rapid convergence and feedback stability over the whole range of input power levels.

Second, they are not robust. They will fail to converge from certain gain states, particularly initial gain states whose phase and amplitude errors are large. For this reason, conventional vector feedback systems must include an alignment amplifier that is manually calibrated to prevent the amplification path from entering gain states that lead to instability or divergence. Such alignment devices generally include a series combination of an adjustable attenuator and an adjustable phase shifter.

Third, they are sensitive to mismatch errors. Time delay differences between circuit loops introduce systematic measurement and control errors. Painstaking manual calibration is generally required to eliminate the effects of these time delay differences over the limited bandwidth of interest.

What is needed is a robust vector feedback system that is less sensitive to varying input power levels. It should converge quickly but remain stable regardless of the input power level or gain error. It should self-calibrate to remove the undesirable effects of loop time delay mismatches.

SUMMARY OF THE INVENTION

In accordance with one aspect of the invention, there is provided an apparatus including an amplifier, a gain error signal generator and a gain adjustment signal generator. The amplifier has an input for receiving an amplifier input signal and an output for producing an amplifier output signal in response to the amplifier input signal and includes a vector modulator for amplifying the amplifier input signal, the vector modulator having a gain adjustment signal input for receiving a gain adjustment signal and having a gain adjustable in response to the gain adjustment signal. The gain error signal generator produces a gain error signal dependent upon the amplifier input signal and the amplifier output signal, the gain error signal having real and imaginary components lying within pre-defined regions in a complex plane. The gain adjustment signal generator generates the gain adjustment signal in response to a region in the complex plane in which an error signal vector defined by the real and imaginary components lies.

Preferably, the pre-defined regions include first and second regions, the first region being a small error region in which the magnitude of the error signal is relatively small and the second region being a large error region in which the magnitude of the error signal is relatively large.

Preferably, the gain adjustment signal generator includes a coarse gain adjustment estimator an a fine gain adjustment estimator for producing a gain error signal.

Preferably, the coarse gain adjustment estimator is rendered operational in producing the gain error signal when the magnitude of the error signal is within the large error region and the fine gain adjustment estimator is rendered operational in producing the gain error signal when the magnitude of the error signal is within the small error region.

Preferably, the apparatus includes an integrator for integrating the gain error signal to produce a scaled gain error estimate signal.

Preferably, the apparatus includes an exponential amplifier for exponentially amplifying the scaled gain error estimate signal Preferably, the gain error signal generator includes first and second time shifters for producing first and second time shifted reference signals respectively and includes a summing junction for summing the first time shifted reference signal with the output signal to produce an error signal. Preferably, the gain error signal generator further includes a correlator for producing a correlated error signal from the error signal and the second time shifted reference signal.

Preferably, the fine gain adjustment estimator is operable to produce a normalized correlated error signal produced by normalizing the correlated error signal with the power of the second time shifted reference signal. Preferably, the fine gain adjustment estimator produces the normalized correlated error signal such that the normalized correlated error signal is approximately equal to a gain error gradient of the error signal.

Preferably, the coarse gain adjustment estimator determines the location of a normalized correlated error signal with respect to pre-defined boundaries and adjusts the normalized correlated error signal according to the location.

Preferably, the gain adjustment signal generator includes an error signal path between the vector modulator and the summing junction, and an on-line calibrator for automatically compensating the second time shifted reference signal for symmetries between the second time shifted reference signal and the error signal path in response to the gain error signal.

Preferably, the vector modulator is exponentially responsive to the gain adjustment signal.

In accordance with another aspect of the invention, there is provided a method of linearizing an amplifier having an input and an output. The method includes the steps of:

a) amplifying the amplifier input signal with a vector modulator having a gain adjustment signal input for receiving a gain adjustment signal and adjusting the gain of the vector modulator in response to a gain adjustment signal to produce an amplifier output signal at the amplifier output;

b) producing a gain error signal dependent upon the amplifier input signal and the amplifier output signal, the gain error signal having real and imaginary components lying within pre-defined regions in a complex plane; and c) generating the gain adjustment signal in response to a region in the complex plane in which an error signal vector defined by the real an imaginary components of the error signal vector lies.

Preferably, the method includes the step of producing a gain error signal using a coarse gain adjustment estimator and a fine gain adjustment estimator.

Preferably, the method includes the step of rendering the coarse gain adjustment estimator operational in producing the gain error signal when the magnitude of the error signal is within a large error region and rendering operational the fine gain adjustment estimator in producing the gain error signal when the magnitude of the error signal is within a small error region.

Preferably, the method includes the step of integrating the gain error signal to produce a scaled gain error estimate signal.

Preferably, the method includes the step of exponentially amplifying the scaled gain error estimate signal Preferably, the method includes the step of producing first and second time shifted reference signals respectively.

Preferably, the method includes the step of summing the first time shifted reference signal with the output signal to produce an error signal.

Preferably, the method includes the step of producing a correlated error signal from the error signal and the second time shifted reference signal.

Preferably, the method includes the step of normalizing the correlated error signal with the power of the second time shifted reference signal to produce a normalized correlated error signal.

Preferably, the method includes the step of producing the normalized correlated error signal such that the normalized correlated error signal is approximately equal to a gain error gradient of the error signal.

Preferably, the method includes the step of determining the location of a normalized correlated error signal with respect to pre-defined boundaries and adjusting the normalized correlated error signal according to the location.

Preferably, the method includes the step of automatically compensating the second time shifted reference signal for symmetries between the second time shifted reference signal and an error signal path, in response to the gain error signal.

Preferably, the method includes the step of exponentially amplifying the amplifier input signal with the vector modulator.

BRIEF DESCRIPTION OF THE DRAWINGS

These and other features, aspects, and advantages of the invention will become better understood with reference to the following drawings, description, and claims, in which:

FIG. 6 is a logic diagram illustrating a large error detection and correction (LEDC) module of the vector feedback system of FIG. 4, the LEDC module being adapted to detect large amplification path gain errors and to output a coarse gain adjustment signal in response;

DETAILED DESCRIPTION

FIG. 1

Conventional Vector Feedback Linearization System

Figure 1:
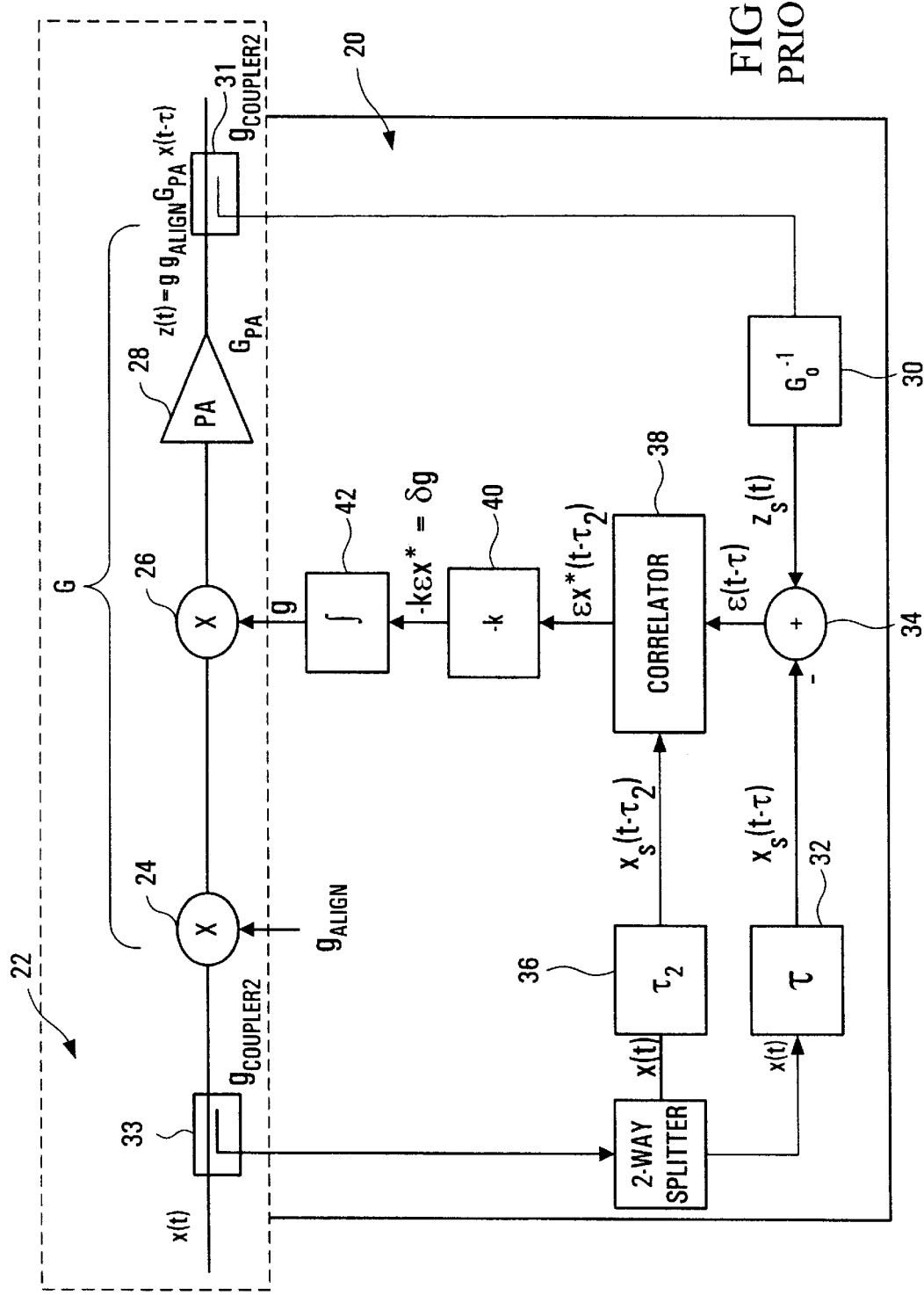
FIG. 1 is a block diagram of a conventional vector feedback system for linearizing the gain of a radio frequency power amplifier.

With reference now to FIG. 1, a conventional vector feedback linearization system is illustrated at 20 connected to an amplification path 22. The amplification path 22 begins with a coupler 33, followed by an alignment amplifier 24, followed by a vector modulator 26, followed by a power amplifier 28, followed by a coupler 31. The alignment amplifier 24, the vector modulator 26, and the power amplifier 28 each have an input port and an output port.

The complex gain $G_{PA}$ of the power amplifier 28 is not constant but varies with the power of the signal received at its input port. The vector modulator 26, which has a third "control" port, has a gain g that varies in response to a signal received at the control port. Under the influence of this control signal, the vector modulator 26 gain g can be adjusted to compensate for gain variations in the power amplifier 28. The complex gain $g_{align}$ of the alignment amplifier 24 is manually calibrated to a value selected to discourage initial instability. The amplification path 22 therefore has a total complex gain $G=g \cdot g_{align} \cdot G_{PA}$ which is the product of the gains of all three devices on the path. The amplification path gain G has a constant value $G_O$ under ideal conditions.

Broadly speaking, the vector feedback linearization system 20 is connected to compare the signal input to the alignment amplifier 24 with the signal output from the power amplifier 28 and to generate in response a signal to adjust the complex gain of the vector modulator 26 whenever the gain G of the amplification path 22 is not equal to its ideal value $G_O$.

Examining the circuit in greater detail, an attenuator 30 is connected through a first RF directional coupler 31 to receive a signal z(t) output from the power amplifier 28. The first directional coupler 31 introduces a signal attenuation $g_{coupler1}$. The attenuator 30 attenuates this signal by the ideal gain $G_O$ of the amplification path 22 to produce a test signal $z_s(t)=z(t) \cdot G_O^{-1} \cdot g_{coupler1}$.

A first time-shifter 32 is connected through a second RF directional coupler 33 and a two-way splitter to receive the signal x(t) input to the alignment amplifier 24. The second directional coupler 33 introduces a signal attenuation $g_{coupler2}$. The splitter introduces a signal attenuation: $g_{splitter}$. The first time-shifter 32 produces a reference signal $x_s(t-\tau)$, delaying the input signal x(t) $\cdot g_{coupler2} \cdot g_{splitter}$ by the time delay τ of the circuit path that starts at the alignment amplifier 24 and ends at the output of the attenuator 30. A summing junction 34 is connected to subtract the reference signal $x_s(t-\tau)$ from the test signal $z_s(t)$ to produce an RF error signal $\epsilon(t-\tau)$.

In parallel, a second time-shifter 36 is connected to receive the coupled input signal $x(t) \cdot g_{coupler2} \cdot g_{splitter}$. The second time-shifter 36 produces a reference signal $x_s(t-\tau_2)$, delaying the coupled input signal $x(t) \cdot g_{coupler2} \cdot g_{splitter}$ by the time delay $\tau_2$ of the circuit path that starts at the alignment amplifier 24 and ends at the output terminal of the summing junction 34.

A correlator 38 is connected to the second time-shifter 36 and to the summing junction 34 to receive and cross-correlate the second reference signal $x_s(t-\tau_2)$ and the RF error signal $\epsilon(t-\tau)$ to yield a correlated error signal $\epsilon x_s^*(t-\tau_2)$ which is proportional to an instantaneous gain error gradient δg of the amplification path 22.

In other words, the time delays τ and $\tau_2$ are selected such that the reference signal $x_s(t-\tau)$ and the feed-back test signal $z_s$ are coincident in time at the summing junction 34 and the second reference signal $x_s(t-\tau_2)$ is coincidental in time with the RF error signal $\epsilon(t-\tau)$ after it propagates to the correlator 38.

A scalar multiplier 40 is connected to multiply the correlated error signal $\epsilon x_s^*(t-\tau_2)$ by a constant −k. The constant k is selected to provide reasonably rapid feedback convergence while maintaining stability. Generally, the product of the constant k and the power of the input signal $x_s(t)$ proportionally determines the slew rate of the vector feedback linearization system 20.

Figure 2:
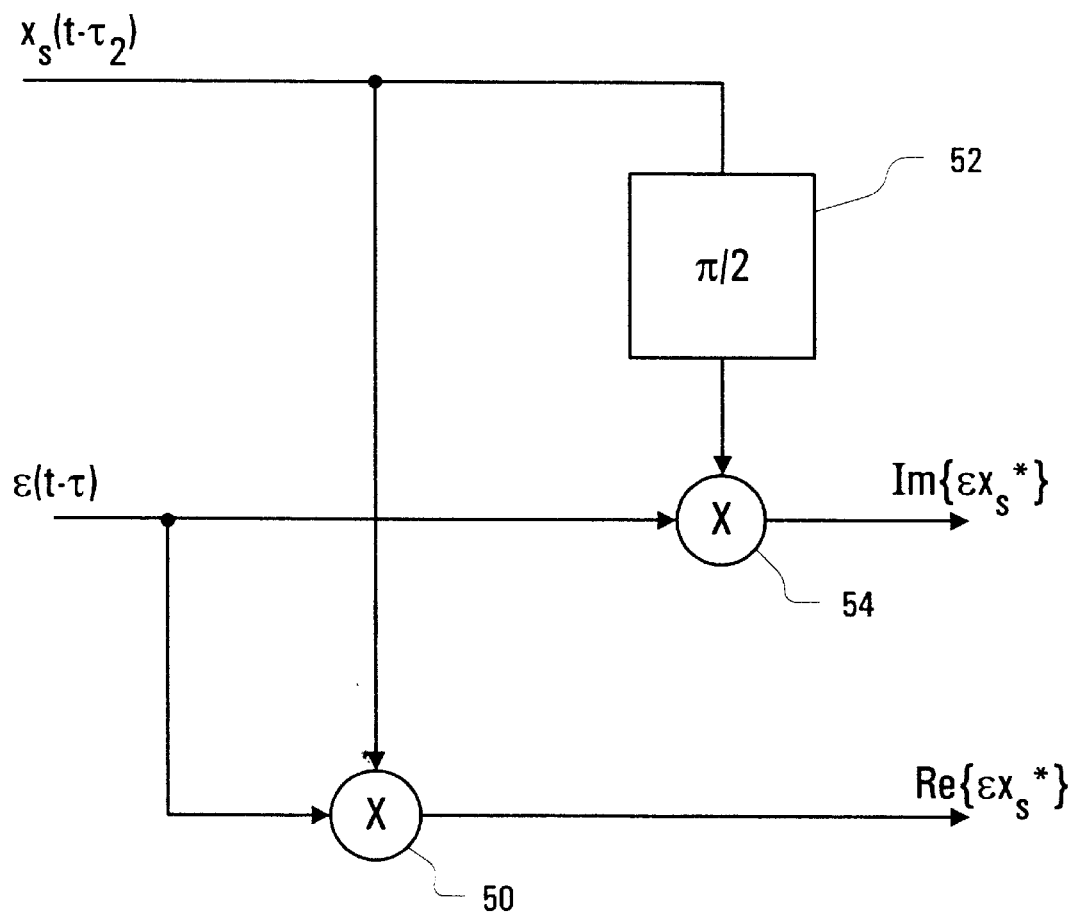
FIG. 2 is a block diagram of a conventional correlator connected within the system of FIG. 1.

Finally, an integrator 42 (a lowpass filter) is connected to integrate the scaled correlated error signal and to feed this integrated signal $-k \int \epsilon x_s^*(t-\tau_2) dt$ back as the gain g to adjust the complex gain of the vector modulator 26.
FIG. 2

Conventional Correlation Circuit

Referring to FIG. 2, the conventional cross-correlation (38) circuit within the vector feedback linearization system 20 is now illustrated.

A first modulator 50 is connected to receive and modulate the second reference signal $x_s(t-\tau_2)$ with the RF error signal $\epsilon(t-\tau)$. The modulated signal $Re\{\epsilon x_s^*(t-\tau_2)\}$ is the real component of the RF error signal $\epsilon(t-\tau)$ correlated to the delayed input signal reference $x_s(t-\tau_2)$, which is small for small errors $\epsilon(t-\tau)$.

In parallel, a phase shifter 52 is connected to receive the second reference signal $x_s(t-\tau_2)$ and to advance its phase by π/2 radians. A second modulator 54 is connected to receive both the π/2 radian phase-advanced second reference signal $x_s(t-\tau_2) \cdot e^{j\pi/2}$ from the phase shifter 52 and the RF error signal $\epsilon(t-\tau)$ and to modulate the two. The modulated signal $Im\{\epsilon x_s^*(t-\tau_2)\}$ is the imaginary component of the RF error $\epsilon(t-\tau)$ signal correlated to the delayed and phase-advanced input signal reference $x_s(t-\tau_2) \cdot e^{j\pi/2}$ which is small for small errors $\epsilon(t-\tau)$.

Together, the real and imaginary components of correlated error signal $Re\{\epsilon x_s^*(t-\tau_2)\}$, $Im\{\epsilon x_s^*(t-\tau_2)\}$ define a complex value $\epsilon x_s^*(t-\tau_2)$ which is proportional to the instantaneous gain error gradient δg of the amplification path 22 and whose magnitude |δg| is large for large errors $\epsilon(t-\tau)$.

With reference to both FIGS. 1 and 2, the conventional vector feedback linearization system 20 has a number of serious weaknesses.

Firstly, it can be seen that the magnitude of the RF error signal $\epsilon(t-\tau)$ produced at the summing junction 34 depends on the magnitude of the amplification path 22 output signal z(t) and the magnitude of the amplification path input signal $x(t-\tau)$. For the same gain error $1-G \cdot G_O^{-1}$, larger input $x(t-\tau)$ and output z(t) signals will produce larger error signals $\epsilon(t-\tau)$. However, for the purpose of correcting a gain error $1-G \cdot G_O^{-1}$, the absolute magnitude of the RF error signal $\epsilon(t-\tau)=z_s(t)-x_s(t-\tau)$ is not so important as the difference between the actual gain $G=z(t) \cdot x(t-\tau)^{-1}$ and the ideal gain $G_O$.

This problem is particularly evident with respect to the scalar multiplier 40. The value of the multiplying scalar k must be large enough to converge the system as quickly as possible while not being so large as to drive the system to instability when the RF error signal $\epsilon(t-\tau)$ is large. The slew rate, ie. responsiveness, of the vector feedback linearization circuit 20 varies with the product of k and the power of the input signal x(t).

Secondly, the alignment amplifier 24 is included in the amplification path 22 to provide a safe initial gain state so that the initial RF error signal $\epsilon(t-\tau)$ will not be so large as to either drive the system to instability or divergence.

Figure 3:
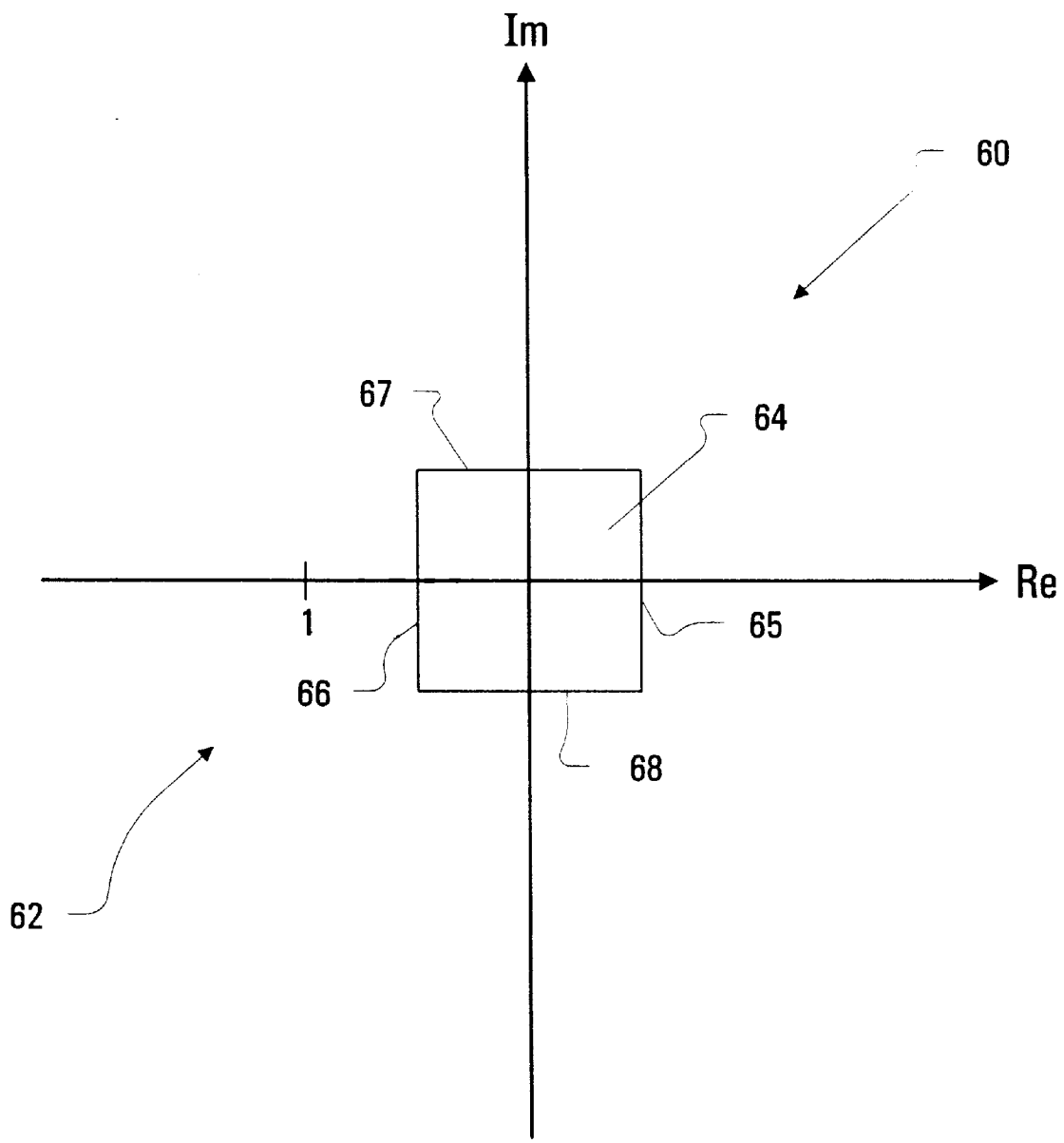
FIG. 3 is a Cartesian diagram illustrating a portion of the complex plane occupied by a correlated error signal, normalized by the input power, the plane being divided into a large error region and a small error region, according to a first embodiment of the invention.

Thirdly, the correlator 38 requires, for accurate results, that the first and second time-shifter 36 introduces a delay that is closely related to the time delay of the feedback path so that circuit path lengths do not introduce frequency-dependent phase offsets.
FIG. 3

Locating the Normalized Correlated Error Signal in the Complex Plane

Referring now to FIG. 3, the portion of the complex plane containing a normalized correlated error signal that has been normalized by the instantaneous power of the input signal, $|x_s|^2$, is illustrated generally at 60. The complex plane is divided into two pre-defined regions: a large error region 62 where the normalized correlated error signal is large, ie., the magnitude of the error signal is relatively large and a small error region 64 where the normalized correlated error signal is small, ie., the magnitude of the error signal is relatively small.

It is desirable that the normalized correlated error signal converges toward the origin (0,0). Unfortunately, conventional feedback systems are not sufficiently robust. Sometimes they take too long to converge to the origin. Sometimes they become unstable and oscillate.

The present invention is directed to facilitating convergence. A useful aspect of the invention is that it distinguishes between large and small normalized correlated error signals. When a small normalized correlated error signal is encountered, a proportional fine gain-error adjustment signal is generated. Alternatively, when a large normalized correlated error signal is encountered, a coarse correction is made to bound the gain adjustment. A bounded control approach is the basis for large error detection and correction, while a gradient-based minimization is the basis for the finer correlation and normalization.

In the illustrative examples to follow, correlated errors normalized by the power of the input signal will be located on the complex plane 60. For the purposes of these examples, a small normalized correlated error signal is defined such that the absolute value of its real component is less than or equal to 0.5 and the absolute value of its imaginary component is less than or equal to 0.5. Conversely, a large normalized correlated error signal is defined such that absolute value of its real component is greater than 0.5 or the absolute value of its imaginary component is greater than 0.5. The upper and lower real component boundaries are indicated respectively at 65 and 66. The upper and lower imaginary component boundaries are indicated respectively at 67 and 68.

FIG. 4

First Embodiment

Figure 4:
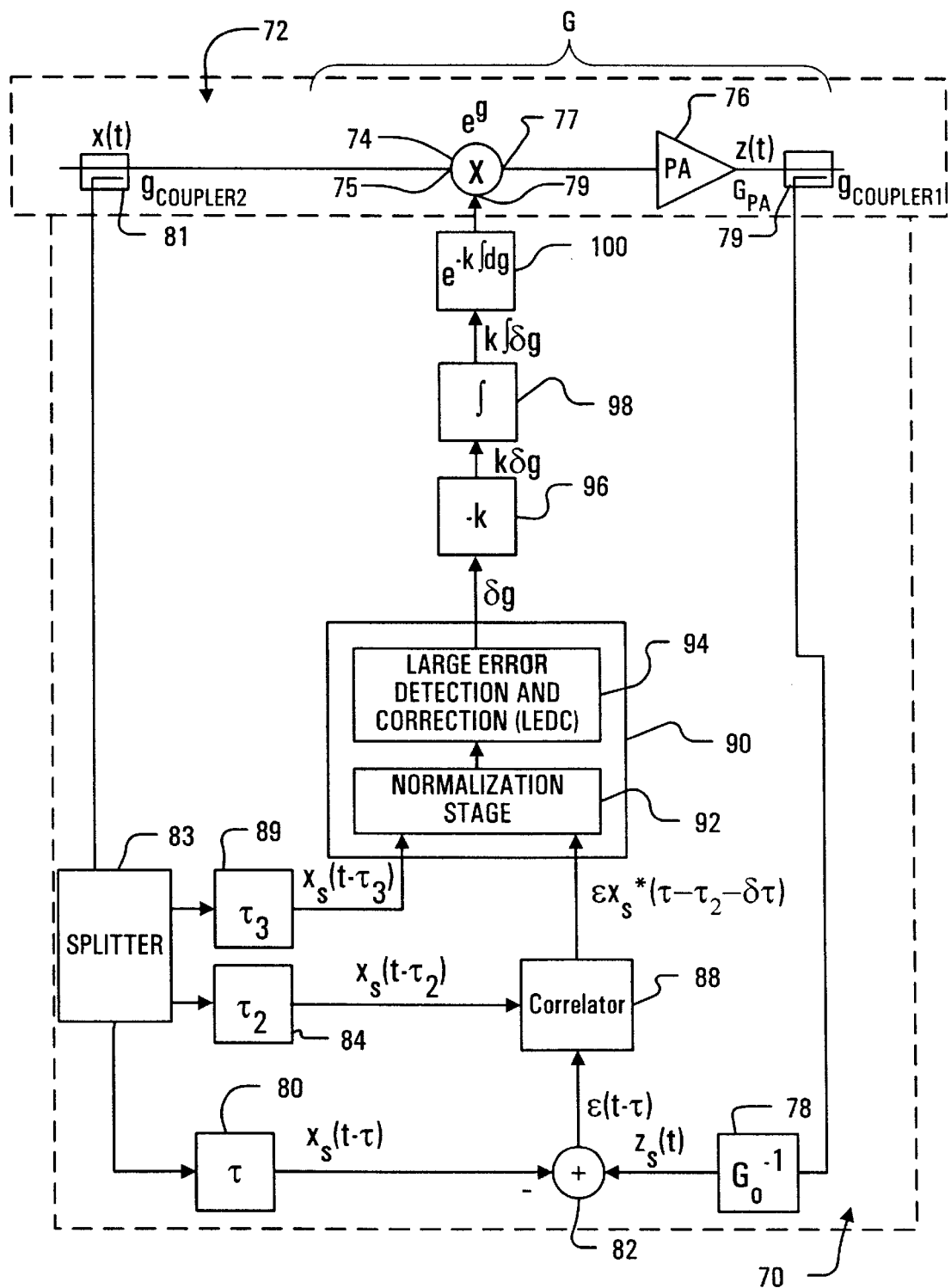
FIG. 4 is a block diagram illustrating a vector feedback system according to a first embodiment of the invention, the system being connected to linearize the gain of a radio frequency power amplifier, according to a first embodiment of the invention.

To this end, a first embodiment of a linearizing vector feedback system is illustrated at 70 in FIG. 4, connected to an amplifier 72. The amplifier 72 begins with a vector modulator 74, which is followed by a power amplifier 76. The vector modulator 74 has an input 75 an output 77 and a gain adjustment input 79. It adjusts the output signal exponentially in response to signals received at the gain adjustment input 79 so that its phase and magnitude offsets, which would otherwise necessitate alignment, are compensated for by the integrating action of the linearizing vector feedback system 70. The input 75 thus acts as an input to the amplifier 72 for receiving an amplifier input signal. The vector modulator thus amplifies the amplifier input signal and has a gain adjustment signal input for receiving a gain adjustment signal and has a gain adjustable in response to the gain adjustment signal.

In overview, the linearizing vector feedback system 70 compares the signals input to and output from the amplifiers 72 to produce an RF error signal $\epsilon(t-\tau)$ that is used to estimate and then generate a gain error adjustment signal used to adjust the complex gain of the vector modulator 74. The gain error adjustment signal is generated using one of two methods, the method selected depending on the size of the error.

In greater detail now, an attenuator 78 is connected through a first RF directional coupler 79, having an attenuation $g_{coupler1}$, to receive an amplifier signal z(t) output from the amplifier 72 for attenuation by the ideal gain of the amplifier 72, $G_O$, to produce an attenuated feed-back test output signal $z_s(t)=z(t)\cdot G_O^{-1}\cdot g_{coupler1}$.

A first time-shifter 80 is connected through a second RF directional coupler 81, having an attenuation $g_{coupler2}$, and a three-way splitter 83 having an attenuation $g_{splitter}$ to receive an attenuated signal $x(t)\cdot g_{coupler2}\cdot g_{splitter}$ coupled from the input to the amplifier 72 and to produce therefrom a first time-shifted reference signal $x_s(t-\tau)$, delayed by the propagation time $\tau$ through the amplifier 72 and the attenuator 78.

A summing junction 82 is connected to receive the test output signal $z_s(t)$ from the attenuator 78 and the time-shifted reference signal $x_s(t-\tau)$ from the first time-shifter 80. Thus the summing junction sums the first time shifted reference signal with the output signal to produce an error signal. The summing junction 82 subtracts the test signal $z_s(t)$ from the time-shifted reference signal $x_s(t-\tau)$ to produce an RF error signal $\epsilon(t-\tau)$. The time delay $\tau$ is selected such that the first reference signal $x_s(t-\tau)$ and the feedback test signal $z_s(t)$ are coincident in time at the summing junction 34.

In parallel, a second time-shifter 84 is connected to the splitter 83 to receive the coupled input signal $x(t)\cdot g_{coupler2}\cdot g_{splitter}$. The second time-shifter 84 produces a second time shifted reference signal $x_s(t-\tau_2)$, delayed by the time delay $\tau_2$ of the circuit path that starts at the vector modulator 74 and ends at the output of the summing junction 82.

A correlator 88 is connected to the summing junction 82 and the output terminal of the second time shifter 84 to receive and cross-correlate the RF error signal $\epsilon(t-\tau)$ and the second reference signal $x_s(t-\tau_2)$ to yield a cross-correlated error signal $\epsilon x_s^*(t-\tau_2-\delta\tau)$ where $\delta\tau$ denotes the propagation time through the correlator. Thus, the correlator produces a correlated error signal from the error signal and the second time shifted reference signal.

The time delay $\tau_2$ is selected such that the second time shifted reference signal $x_s(t-\tau_2)$ is coincident in time with the RF error signal $\epsilon(t-\tau)$ after it propagates to the correlator 88.

In parallel, a third time-shifter 89 is connected to the splitter 83 to receive the coupled input signal $x(t)\cdot g_{coupler2}\cdot g_{splitter}$. The third time-shifter 89 produces a third time-shifted reference signal $x_s(t-\tau_3)$, delayed by the time delay $\tau_3$ of the circuit path that starts at the vector modulator 74 and ends at the output of the correlator 88.

A gain adjustment estimator 90 is connected to receive both the RF error signal $\epsilon x^*(t-\tau_2)$ from the correlator 88 and the time-shifted third reference signal $x_s(t-\tau_3)$ from the third time-shifter 89 to produce an estimate of the instantaneous gain adjustment $\delta g$ necessary to linearize the amplifier 72. As the time-shifted third reference signal is derived from the amplifier input signal by the third time shifter and the RF error signal is derived from the amplifier output signal by the correlator 88, it may be said that the gain adjustment estimator 90 acts as a gain error signal generator which produces a gain error signal dependent upon the amplifier input signal and the amplifier output signal, the gain error signal having real and imaginary components lying within pre-defined regions in a complex plane.

The time delay $\tau_3$ is selected such that the third reference signal $x_s(t-\tau_3)$ is coincident in time with the correlated RF error signal $\epsilon x_s^*(t-\tau_2-\delta\tau)$ after it propagates to the gain adjustment estimator 90.

The gain adjustment estimator 90 is constructed to generate the appropriate fine or coarse estimate of the instantaneous gain adjustment $\delta g$ necessary to converge the amplifier 72 gain G toward an ideal linear response $G_O$. To this end, a fine gain adjustment estimator 92 is connected to receive the correlated error signal $\epsilon x_s^*(t-\tau 2-\delta\tau)$ and to normalize it with respect to the power of the third reference signal $x_s(t-\tau_3)$. For sufficiently small values, the normalized correlated error signal $|(\epsilon_x^*(t-\tau_2-\delta\tau)|\cdot x_s(t-\tau_2)^{-2})$ approximately equals the instantaneous gain-error gradient $\delta g$. With reference back to FIG. 3, it will be recalled that "sufficiently small" was defined to mean that the absolute values of both the real and imaginary components of the estimate are less than 0.5. If the criterion of sufficient smallness is met, then the fine estimate is the one generated by the gain adjustment estimator 90.

Referring back to FIG. 4, a coarse gain adjustment estimator 94 is connected to receive the normalized correlated error signal $(\epsilon x_s^*\cdot|x_s|^{-2})$ from the fine gain adjustment estimator 92. In the event that the finely estimated gain adjustment falls in the large error region (62) of the complex plane (60), then the gain adjustment estimate generated by the coarse gain adjustment estimator 94 is the one selected for output from the gain adjustment estimator 90. Thus, the fine gain adjustment estimator is operable to produce a normalized correlated error signal produced by normalizing the correlated error signal with the power of the second time shifted reference signal. In addition, the fine gain adjustment estimator produces the normalized correlated error signal such that the normalized correlated error signal is approximately equal to a gain error gradient of the error signal.

The coarse gain adjustment estimator 94 locates the normalized correlated error signal $(\epsilon x^*_s\cdot|x_s(t-\tau_2)|^{-2})$ with respect to the boundaries (65), (66), (67), (68) dividing the large (62) and small (64) error regions of the complex plane (60) of FIG. 3. Based on this coarse location of the normalized correlated error signal $(\epsilon x^*_s\cdot|x_s|^{-2})$, the coarse gain adjustment estimator 94 applies a set of rules to coarsely select a complex gain adjustment that will stably, and rapidly, drive the gain error $\delta g$ toward the small error region (64) of the complex plane (60). The gain adjustment signal generator generates a gain adjustment signal in response to a region in the complex plane in which an error signal vector defined by the real and imaginary components lies and the gain adjustment signal generator includes a coarse gain adjustment estimator an a fine gain adjustment estimator for producing a gain error signal. In addition, it will be appreciated that the coarse gain adjustment estimator determines the location of a normalized correlated error signal with respect to pre-defined boundaries and adjusts the normalized correlated error signal according to the location.

A scalar multiplier 96 is connected to the gain adjustment estimator 90 to receive and multiply the gain-error estimate signal $+\delta g$ by a scalar $-k$.

An integrator 98 is connected to the scalar multiplier 96 to receive and integrate the scaled gain error estimate signal $-k\delta g$. Thus, the apparatus includes an integrator for integrating the gain error signal to produce an integrated scaled gain error estimate signal.

An exponential amplifier 100 is connected to the integrator 98 to exponentially amplify the integrated and scaled gain error estimate signal $-k\int dg$ to direct an exponential control signal $e^{-k\int dg}$ to the vector modulator 74. Thus, the apparatus includes an exponential amplifier for exponentially amplifying the integrated scaled gain error estimate signal It will be appreciated that the gain adjustment signal generator includes an error signal path between the vector modulator and the summing junction.

Figure 5:
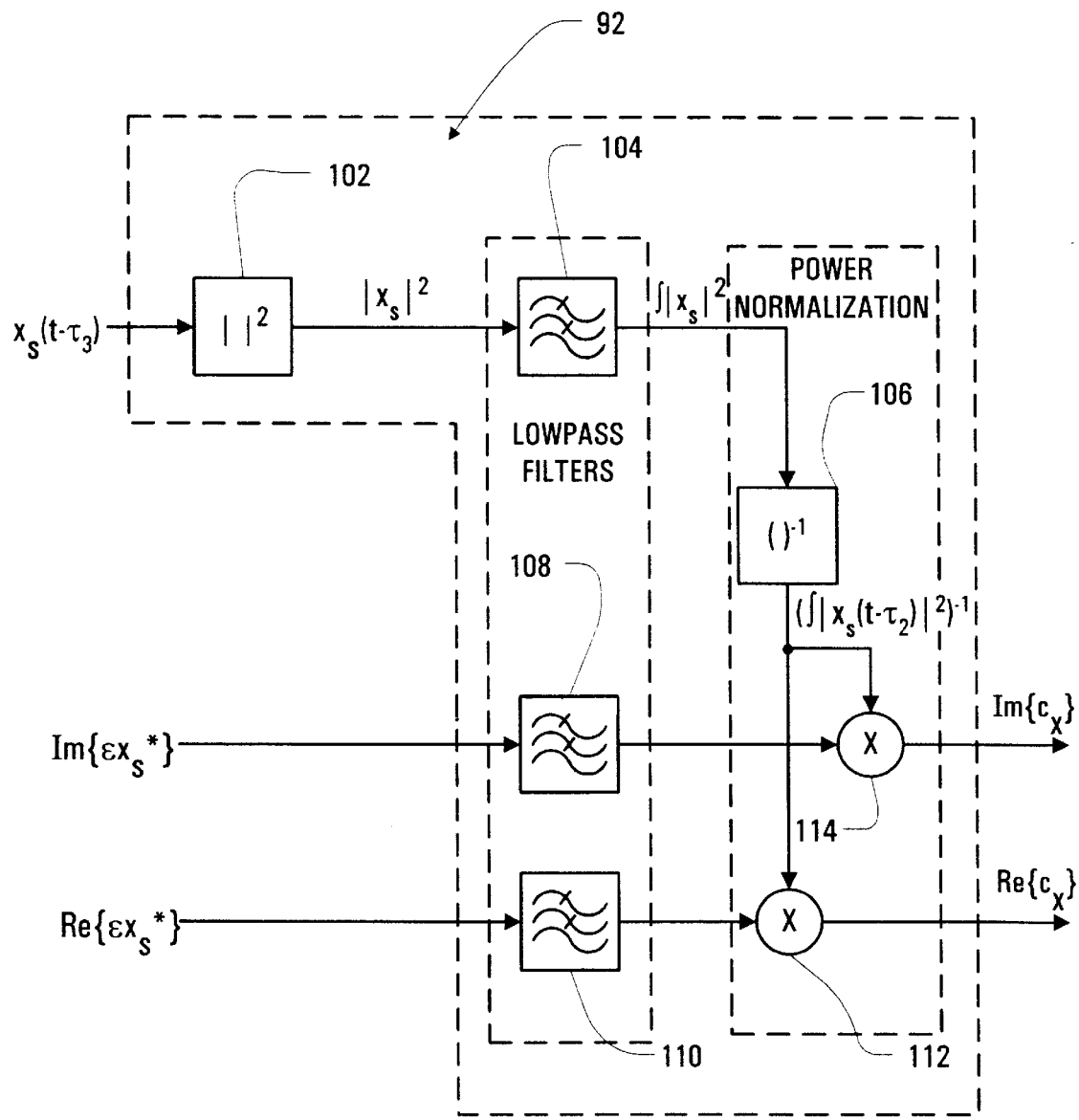
FIG. 5 is a block diagram illustrating a normalization module of the vector feedback system of FIG. 4, the normalization module being adapted to output a fine gain adjustment signal for small amplification path gain errors.

FIG. 5
Normalization Module Fine Gain Adjustment

With reference now to FIG. 5, the normalization module 92 is further illustrated. Referring briefly to FIG. 4, the normalization module 92 is connected to the third time-shifter 89 and the correlator 88 to receive respectively the third time-shifted reference signal $x_s(t-\tau_3)$, and the real and imaginary components of the correlated error signal $\epsilon x_s^*(t-\tau_2-\delta\tau)$ as shown in FIG. 5.

A squaring device 102 such as a diode detector biased for square law operation, a lowpass filter 104, and an inverter 106 are connected in series to receive and transform the third time-shifted reference signal $x_s(t-\tau_3)$, successively squaring, integrating, and inverting the signal to yield a normalizing scalar magnitude $(\int|x_s(t-\tau_3)|^2)^{-1}$.

Second and third lowpass filters 108, 110 are connected to respectively integrate the real component of the correlated error signal $\mathrm{Re}\{\epsilon x_s^*(t-\tau_2)\}$, and the imaginary component of the correlated error signal $\mathrm{Im}\{\epsilon x_s^*(t-\tau_2)\}$. The frequency responses of the three lowpass filters 104, 108, 110 are preferably matched.

Finally, first and second analogue multipliers 112, 114 are connected to receive the normalizing scalar magnitude $(\int|x_s(t-\tau_3)|^2)^{-1}$ for modulation with the real component of the integrated correlated error signal $\mathrm{Re}\{\int\epsilon x_s^*(t-\tau_2)\}$ and the imaginary component of the integrated correlated error signal $\mathrm{Im}\{\int\epsilon x_s^*(t-\tau_2)\}$ respectively to yield normalized real and imaginary $\epsilon x_s^*(t-\tau_2-\delta\tau)$ components of the correlated error signal $\mathrm{Re}\{(\int\epsilon x_s^*(t-\tau_2-\delta\tau))\cdot(\int|x_s(t-\tau_3)|^2)^{-1}\}$ and $\mathrm{Im}\{(\int\epsilon x_s^*(t-\tau_2-\delta\tau))\cdot(\int|x_s(t-\tau_3)|^2)^{-1}\}$ which are reasonable approximations of the real and imaginary components of the gain error gradient $\delta g$ if they fall within the small error region (64) of the complex plane (60) shown in FIG. 3.

FIG. 6
Large Error Detection and Correction (LEDC) Module for Coarse Gain Adjustment With reference now to FIGS. 3 and 6, the LEDC module 94 is further illustrated. The LEDC module 94 is connected to the normalization module 92 to receive the real and imaginary components of the normalized correlated error signal $\mathrm{Re}\{(\int\epsilon x_s^*)(|x_s|^2)^{-1}\}=\mathrm{Re}\{c_x\}$ and $$Im\{(\int\epsilon x_s^*)(|x_s|^2)^{-1}\}=Im\{c_x\}$$

The LEDC module 94 implements a set of functions that are discontinuous at the boundaries 65, 66, 67, 68 on the complex plane 60 dividing the large error and small error regions 62 and 64 respectively.

If as shown at 116, the real and imaginary component of the normalized correlated error signal $\{c_x\}$ are within the small error region 64, then as shown at 118 the LEDC module 94 sets the real and imaginary component of the gain adjustment signal $\{\delta g(t)\}$ equal to the real and imaginary component of the normalized correlated error signal $\{c_x\}$.

However, if as shown at 120, the real component of the normalized correlated error signal $\mathrm{Re}\{c_x\}$ is above boundary 65 then as shown at 122 the LEDC module 94 sets the real and imaginary component of the gain adjustment signal $\{\delta g(t)\}$ equal to the real and imaginary components of the normalized correlated error signal $c_x$ multiplied by a scale factor a that is indicative of the amount that $c_x$ must be reduced to touch one of the boundaries 65, 67, 68 or to lie within the small error region.

However, if as shown at 124 the imaginary component of the normalized correlated error signal $\mathrm{Im}\{c_x\}$ is within the large error region 62, and $\mathrm{Re}\{c_x\}$ exceeds the boundary 66 then 126 the LEDC module 94 sets the real and imaginary components of the gain adjustment signal $\{\delta g(t)\}$ equal to the real and imaginary components of the normalized correlated error signal $c_x$ the adjustment multiplied by a scale factor $\alpha$ that is indicative of the amount that $c_x$ must be reduced to touch one of the boundaries 65, 67, 68.

Finally, if as shown at 128 and 132 the error is estimated to be very large as indicated by the fact that the real component of the normalized correlated error signal Re$\{c_x\}$ is below the lower real boundary 66, then as shown at 130 and 134, an extra constant term +/−B$\phi$ is added to the estimate of the imaginary component of the gain adjustment signal Im$\{\delta g(t)\}$ to speed convergence. If the imaginary components of the normalized correlated error signal Im$\{c_x\}$ is negative then −B$\phi$ is used, otherwise B$\phi$ is added to Im$\{\delta g\}$.

FIG. 7

Block Diagram Overview of LEDC Module

Figure 7:
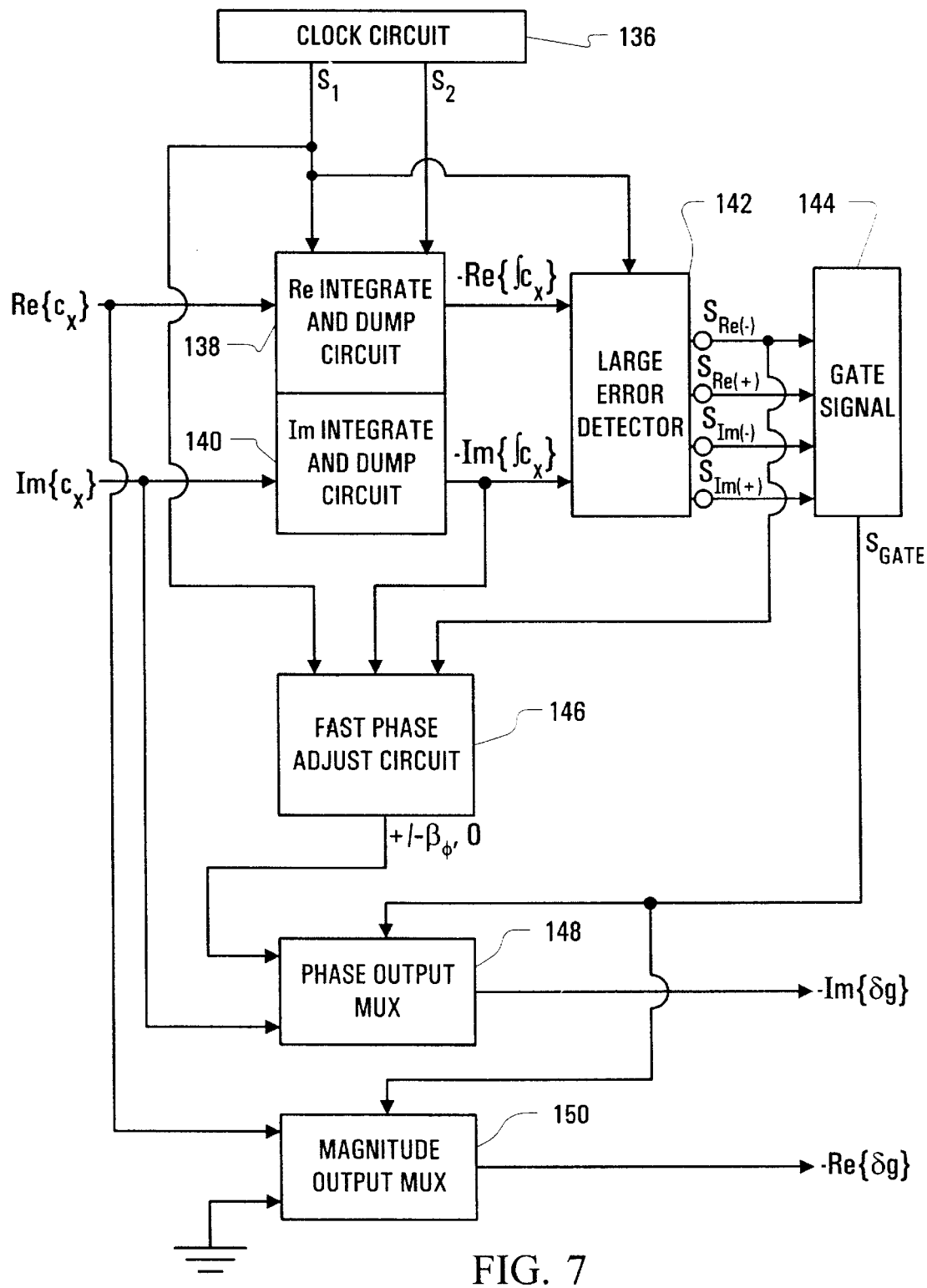
FIG. 7 is a block diagram overview of the LEDC module of FIG. 6 in the vector feedback system of FIG. 4.

With reference now to FIG. 7, the LEDC module 94 is now illustrated in overview block diagram form. The LEDC module 94 is connected to receive the real and imaginary components Re$\{c_x\}$, Im$\{c_x\}$ of the normalized correlated error signal $c_x$ from the normalization module 92.

A clock circuit 136 generates a symmetrical clock signal $S_1$ and its complement $S_2$.

Real and imaginary integrate-and-dump circuits 138, 140 are connected to respectively receive the real and imaginary components of the normalized correlated error signal Re$\{c_x\}$, Im$\{c_x\}$. The integrate-and-dump cycles of the real and imaginary integrate-and-dump circuits 138, 140 are timed by the clock circuit 136, with the clock signal $S_1$ starting an integration interval and the clock complement signal $S_2$ starting a dumping interval.

A large error detector 142 is connected to the real and imaginary integrate-and-dump circuits 138, 140 to receive the real and imaginary components of the normalized and integrated correlated error signal Re$\{\int c_x\}$, Im$\{\int c_x\}$. Referring to FIGS. 3 and 7, the large error detector 142 compares these components to the boundaries (65), (66), (67), (68) in the complex plane (60) that divide the large error region (62) from the small error region (64).

The large error detector 142 is constructed to generate four boundary control signals in response to this comparison. A first boundary control signal $S_{Re(-)}$ indicates that the real component Re$\{\int c_x\}$ is below the lower real boundary 66. A second control boundary signal $S_{Re(+)}$ indicates that the real component Re$\{\int c_x\}$ is above the upper real boundary 65. A third boundary control signal $S_{Im(-)}$ indicates that the imaginary component Im$\{\int c_x\}$ is below the lower imaginary boundary 68. A fourth boundary control signal $S_{Im(+)}$ indicates that the imaginary component Im$\{\int c_x\}$ is above the upper imaginary boundary 67.

A gate signal generator 144 is connected to receive the four boundary control signals $S_{Re(-)}$, $S_{Re(+)}$, $S_{Im(-)}$, $S_{Im(+)}$ and to generate in response, a gate signal $S_{gate}$. The gate signal $S_{gate}$ is therefore a function of the complex plane location of the normalized correlated error signal $c_x$.

A fast phase adjust circuit 146 is connected to receive the integrated and normalized imaginary component of the correlated error Im$\{\int c_x\}$, the first clock $S_1$ and the first boundary control signal $S_{Re(-)}$. The fast phase adjust circuit 146 is constructed to generate a properly polarized accelerated phase adjust signal +/=B$\phi$ in the event that the normalized correlated error signal $c_x$ is sufficiently large as indicated by the first boundary control signal $S_{Re(-)}$. A ground signal is generated by the fast phase adjust circuit 146 when the real component of $c_x$ is above the lower real boundary 66.

An imaginary component output multiplexer 148 is connected to receive the output of the fast phase adjust circuit 146 and the imaginary component of the normalized correlated error signal Im$\{c_x\}$ and to output one signal or the other as the imaginary component of the gain error adjustment signal Im$\{\delta g\}$ under the control of the gating signal $S_{gate}$.

Similarly, a real component output multiplexer 150 is connected to a ground signal and the real component of the normalized correlated error signal Re$\{c_x\}$ and to output one signal or the other as the real component of the gain error adjustment signal Re$\{\delta g\}$ under the control of the gating signal $S_{gate}$.

FIG. 8

Figure 8:
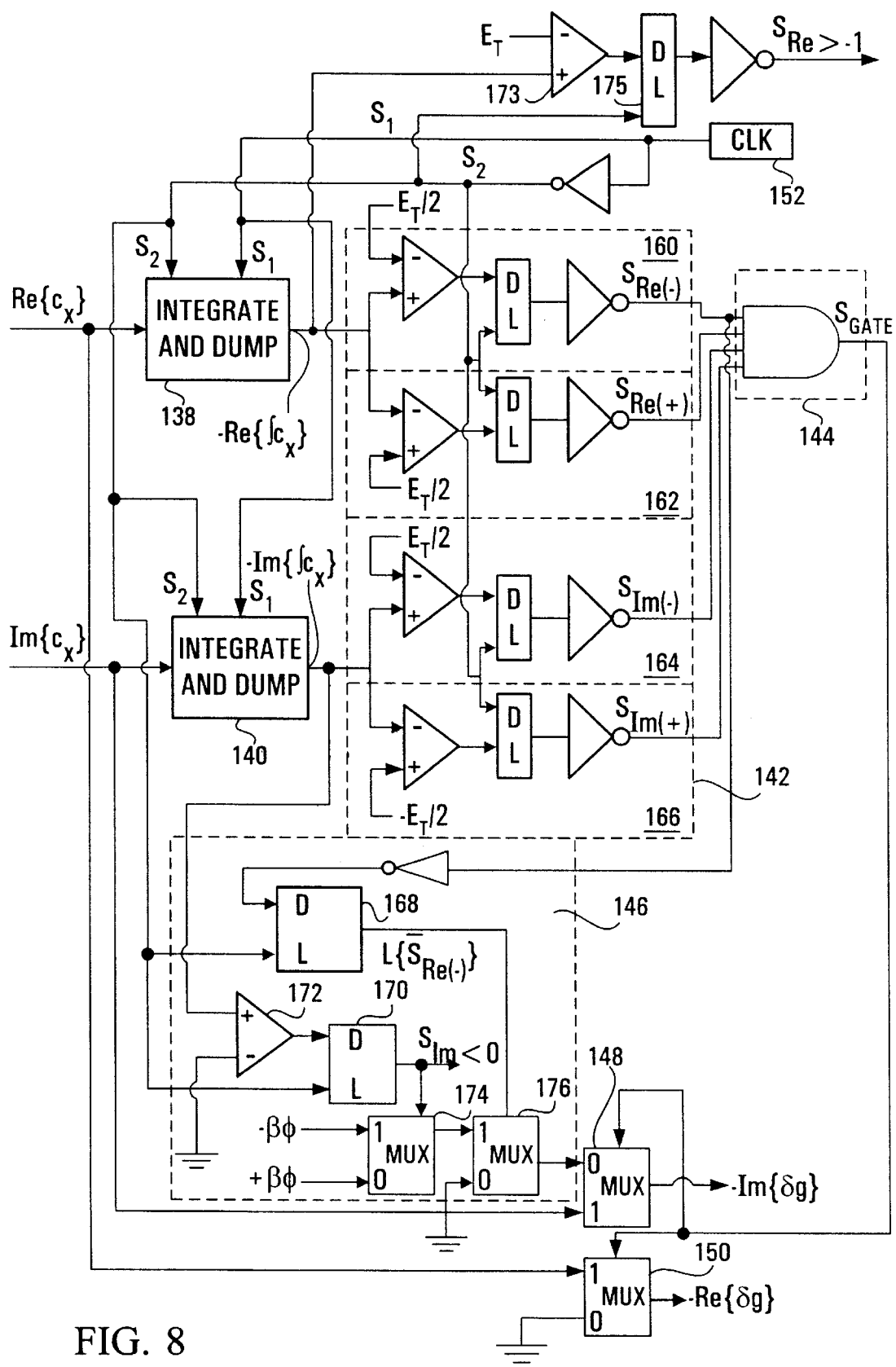
FIG. 8 is a detailed block diagram showing the LEDC module of FIG. 6 in the vector feedback system of FIG. 4.

With reference to FIG. 8, the LEDC module 94 will now be described in greater detail.

The clock circuit 136 includes a clock 152 that generates the symmetrical clock signal $S_1$. The clock complement signal $S_2$ is produced as the result of a NOT operation performed on the clock signal $S_1$.

The large error detector 142 includes four latched comparators 160, 162, 164, 166, having respective outputs which are regularly refreshed under the control of the clock complement signal $S_2$.

The first and second comparators 160, 162 are connected to receive the integrated real component of the normalized correlated error signal Re$\{\int c_x\}$ from the real integrate-and-dump circuit 138. The first comparator 160 is constructed to compare the integrated real component of the normalized correlated error signal Re$\{\int c_x\}$ to a predetermined threshold level $-E_T/2$ and to produce a high output when the integrated real component of the normalized correlated error signal Re$\{\int c_x\}$ is less than that value. Similarly, the second comparator 162 is constructed to compare the integrated real component of the normalized correlated error signal Re$\{\int c_x\}$ to a predetermined threshold level $E_T/2$ and to produce a high output when the integrated real component of the normalized correlated error signal Re $\{\int c_x\}$ is greater than that value.

The third and fourth comparators 164, 166 are connected to receive the integrated imaginary component of the normalized correlated error signal Im$\{\int c\}$ from the imaginary integrate-and-dump circuit 140. The third comparator 164 is constructed to compare the integrated imaginary component of the normalized correlated error signal Im$\{\int c_x\}$ to a predetermined threshold level $-E_T/2$ and to produce a high output when the integrated imaginary component of the normalized correlated error signal Im$\{\int c_x\}$ is less than that value. Similarly, the fourth comparator 166 is constructed to compare the integrated imaginary component of the normalized correlated error signal Im$\{\int c_x\}$ to a predetermined threshold level $E_T/2$ and to produce a high output when the integrated imaginary component of the normalized correlated error signal Im$\{\int c_x\}$ is greater than that value.

The first through fourth boundary control signals $S_{Re(-)}$, $S_{Re(+)}$, $S_{Im(-)}$, $S_{Im(+)}$, are produced as the result of NOT operations performed respectively on the outputs of the first through fourth latched comparators 160, 162, 164, 166.

The gate signal generator 144 produces an output signal $S_{gate}$ that is the result of an AND operation performed on the first through fourth boundary control signals $S_{Re(-)}$, $S_{Re(+)}$, $S_{Im(-)}$, $S_{Im(+)}$.

The fast phase adjust circuit 146 includes first and second latches 168, 170 that are connected to be latched by the clock complement signal $S_2$. The first latch 168 is connected to receive as data an inversion of the first boundary control signal $S_{Re(-)}$.

A fifth comparator 172 is connected to receive the integrated imaginary component of the normalized correlated error signal Im$\{\int c_x\}$ at its positive terminal and a ground level at its negative terminal to produce an imaginary polarity control signal $S_{Im<0}$ that indicates the polarity of the imaginary component of the normalized correlated error signal Im$\{\int c_x\}$. The second latch 170 is connected to receive as data, the output of the fifth comparator 172. The output of the second latch 170 is a fifth boundary control signal $S_{Im<0}$ which denotes that the imaginary component of the normalized correlated error signal $Im\{\int c_x\}$ is negative.

A polarity multiplexer 174 is connected to receive at its first input terminal a negative constant level $-B\phi$ and at its second input terminal a positive constant level $+B\phi$. The output of the polarity multiplexer 174 is selected by the output of the second latch 170.

A convergence accelerator multiplexer 176 is connected to receive at its first input terminal the output of the polarity multiplexer and at its second input terminal a ground level. The output of the convergence accelerator multiplexer, which is the output of the fast phase adjust circuit 146, is selected by the output of the first latch 168.

It is also desirable to use the LEDC module 94 to generate a sixth boundary control signal $S_{Re>-1}$ to denote that the real component of the normalized correlated error signal $Re\{c_x\}$ is greater than $-1$. To this end, a sixth comparator 173 is connected to receive at its positive terminal the integrated real component of the normalized correlated error signal $Re\{c_x\}$ and to receive at its negative terminal a predetermined threshold level $E_T$, such that the sixth comparator 173 will generate a high output when the integrated real component of the normalized correlated error signal $Re\{c_x\}$ is greater than that threshold.

A third latch 175 is connected to be latched by the clock complement signal $S_2$ and to receive as data the output of the sixth comparator 173. The sixth boundary control signal $S_{Re>-1}$ is generated as the inverted output of the third latch 175.

FIG. 9

Figure 9:
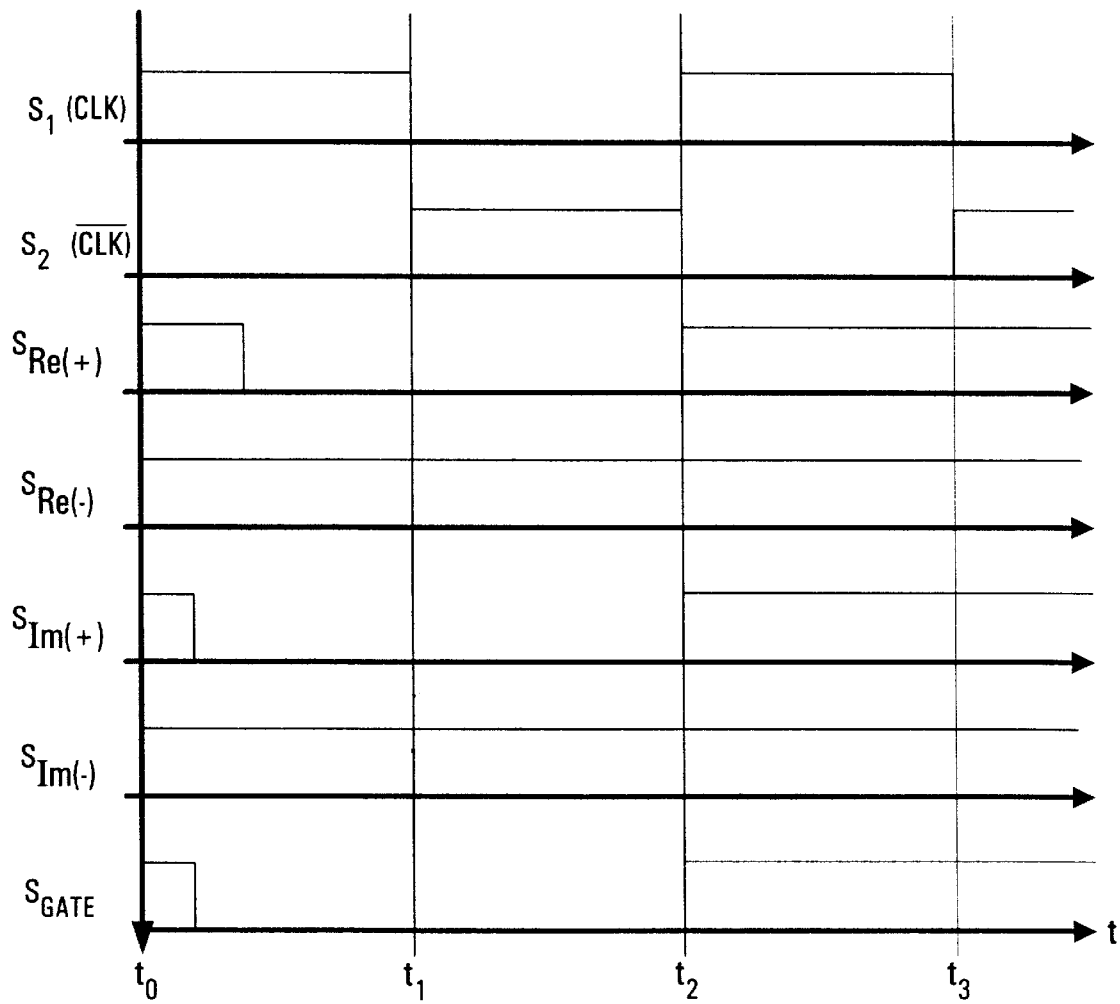
FIG. 9 is a timing diagram of certain signals generated by the implementation of large error detection and correction module of FIG. 6 in the vector feedback system of FIG. 4.

With reference to FIGS. 7, 8, and 9, the operation of the LEDC module 94 will be further described.

In the clock circuit 136, the synchronizing clock signal $S_1$ has rising edges at $t_O$ and $t_2$ and falling edges at $t_1$ and $t_3$. In contrast, the clock complement signal $S_2$ has rising edges at $t_1$ and $t_3$ and falling edges at $t_0$ and $t_2$.

The real and imaginary integrate-and-dump circuits 138, 140 cycle under the control of the clock signal $S_1$ and the clock complement signal $S_2$ to respectively integrate the real and imaginary components of the normalized correlated error signal $c_x$.

The integrated components of the normalized correlated error signal $Re\{\int c_x\}$, $Im\{\int c_x\}$, are fed into the large error detector 142 to the first, second, third, and fourth latched comparators 160, 162, 164, 166, to test whether the components are within the large error (62) or small error (64) regions of the complex plan (60). The latched comparators 160, 162, 164, 166, whose hold states are controlled by the clock complement signal $S_2$, go low if the signal component under test is on the small error region (64) side of the boundaries (65), (66), (67), (68) and go high if the signal component under test is on the large error region (62) side of the boundaries (65), (66), (67), (68). The inverted outputs of these four latched comparators 160, 162, 164, 166 become respectively the boundary control signals $S_{Re(-)}$, $S_{Re(+)}$, $S_{Im(-)}$, $S_{Im(+)}$.

The gate signal generator 144 performs an AND operation on the four boundary control signals $S_{Re(-)}$, $S_{Re(+)}$, $S_{Im(-)}$, $S_{Im(+)}$ to produce a gate signal $S_{gate}$. The gate signal $S_{gate}$ is used both to bound large error signals (coarse adjustment) and to pass unaffected small normalized correlated error signals. This is achieved because the gate signal $S_{gate}$ embodies information about the complex plane (60) location of the error signal. The gate signal $S_{gate}$ is therefore used effectively to control the imaginary component output multiplexer 148 and the real component output multiplexer 150 to generate the appropriate gain adjustment signal $\delta_g$ as either a pulse width modulated (bounded) large error signal or an unimpeded normalized correlated small error signal received from the normalization module 92.

The real component of the gain adjustment signal $\delta g$ is generated at the output of the real component output multiplexer 150. The gate signal $S_{gate}$ selects this output to be either the real component of the normalized correlated error signal $Re\{c_x\}$ or the ground level. In effect, the gate signal $S_{gate}$ allows a measured burst of feedback to propagate through the system, adjusting these bursts according to the location in the complex plane (60) of the normalized correlated error signal $c_x$.

The imaginary component of the gain adjustment signal $\delta g$ is generated in a slightly more complicated manner at the output of the imaginary component output multiplexer 148. The first and second latches 168, 170 are loaded in synchronization with the clock complement signal S2. The first latch 168 is loaded with the value of the first boundary signal $S_{Re(-)}$ because a low value for that signal would indicate that a significant gain error exists. At the same time, the second latch 170 is loaded with the value output by the fifth comparator 172, which in effect represents the polarity of the gain phase error.

The output of the second latch 170 controls the polarity multiplexer 174, selecting its output to be either a positive constant $+B\phi$ or a negative constant $-B\phi$. The output of the first latch 168 controls the convergence accelerator multiplexer, selecting between the output of the polarity multiplexer 174 (one of the constants $+B\phi$ or $-B\phi$), or a ground level. The value selected will be the ground level unless a significant gain error exists as indicated by a low value for the first boundary signal $S_{Re(-)}$.

At this point, the imaginary component of the gain adjustment signal $\delta g$ is simply generated as the output of the imaginary component output multiplexer 148. The gate signal $S_{gate}$ selects this output to be either the imaginary component of the normalized correlated error signal $Im\{c_x\}$ or the output of the convergence accelerator multiplexer 176.

FIG. 10

On-line Calibration Module

Figure 10:
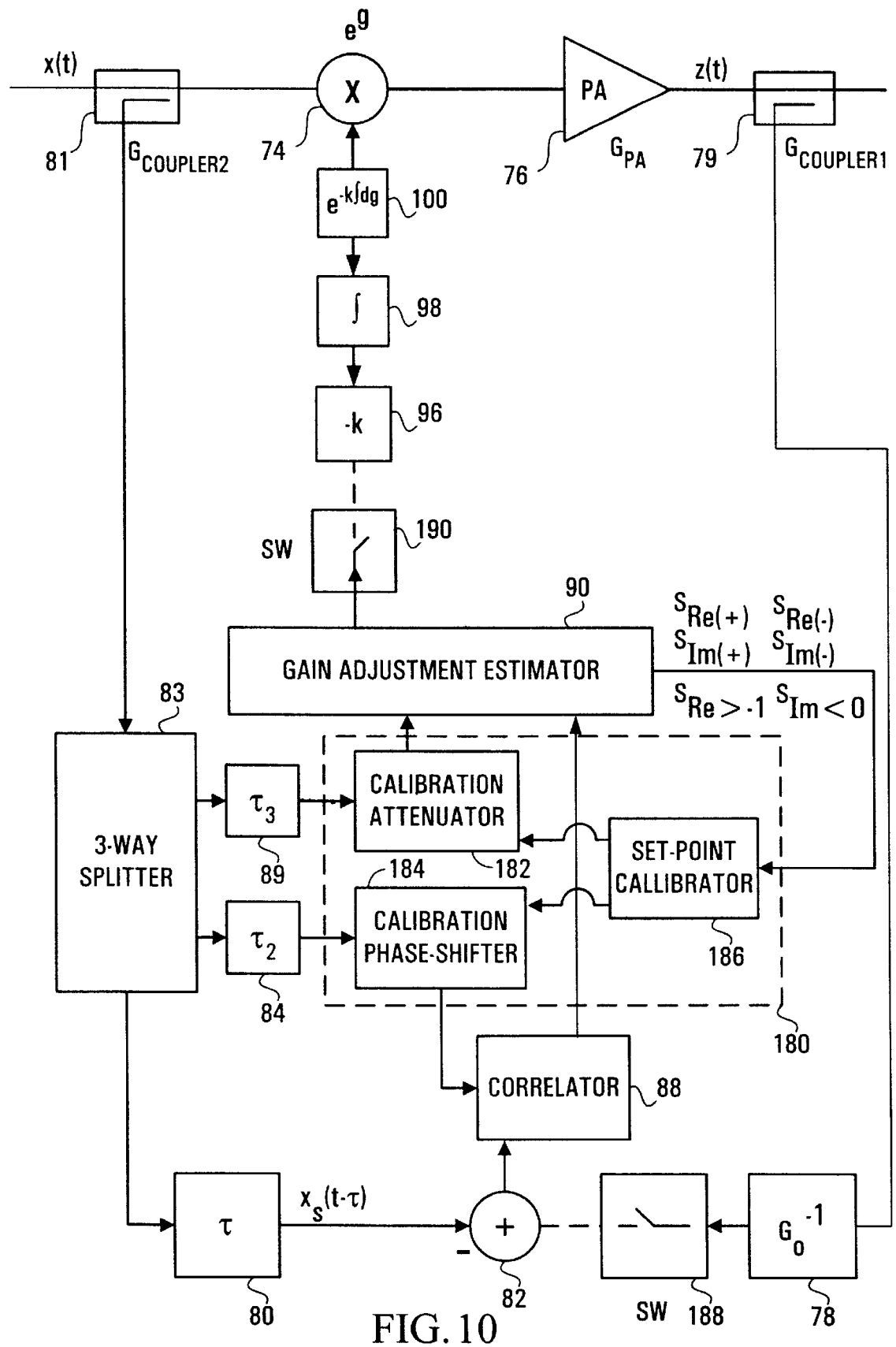
FIG. 10 is a block diagram showing an on-line calibration module connected within the vector feedback system of FIG. 4.

With reference now to FIG. 10, an on-line calibration circuit is illustrated in greater detail at 180. The on-line calibration circuit 180 is connected into the linearizing vector feedback system 70 for the purpose of automatically compensating for any asymmetries between the second reference signal path $x_s(t-\tau_2)$ and the RF error signal path $\epsilon(t-\tau)$. Unless those two signals are properly aligned at the correlator, their cross-correlation will suffer from systemic errors. Thus, the gain adjustment signal generator includes an on-line calibrator for automatically compensating the second time shifted reference signal for asymmetries between the second time shifted reference signal and the error signal path, in response to the gain error signal.

The calibration circuit includes a calibration attenuator 182, a calibration phase shifter 184 and a set-point calibrator 186. The calibration attenuator 182 connects the output terminal of the third time-shifter 89 to an input terminal of the gain adjustment estimator 90, and in response to a first calibration signal, attenuates the amplitude of the third reference signal $x_s(t-\tau_3)$. The calibration phase-shifter 184 connects the output terminal of the second time-shifter 84 to an input terminal of the correlator 88, and in response to a second calibration signal, shifts the phase of the second reference signal $x_s(t-\tau_2)$. The set-point calibrator 186 is connected to the calibration attenuator 182 and the calibration phase-shifter 184 to provide the first and second calibration signals.

The set-point calibrator 186 is also connected to receive from the gain adjustment estimator 90, the six boundary control signals $S_{Re(+)}$, $S_{Re(-)}$, $S_{Im(-)}$, $S_{Im(+)}$, $S_{Im}<0$ and $S_{Re>-1}$.

Under the control of the on-line calibration module 180, first and second switches 188, 190 are connected to temporarily alter the linearizing vector feedback system 70 during on-line calibration. The first switch 188 connects the attenuator 78 to the summing junction 82. The first switch 188 is normally closed; however, during on-line calibration it is opened to disconnect the attenuator 78 from the summing junction 82 such that the signal leaving the summing junction 82 is the additive inverse of the reference signal $-x_s(t-\tau)$.

The second switch 190 disconnects the feedback path between the gain adjustment estimator 90 and the scalar multiplier 96 so that the calibration process will not affect the amplifier 72.

During calibration, the RF error signal $\epsilon(t-\tau)$ is equal to the additive inverse of the first reference signal $-x_s(t-\tau)$. Therefore normalized cross-correlation will yield $[\epsilon(t-\tau-\delta\tau_{82,88})\cdot x_s(t-\tau_2\delta\tau_{88,90})^*]\cdot|x_s(t-\tau_3)|^{-2} = [-x_s(t-\tau-\delta\tau_{82,88})\cdot x_s(t-\tau_2-\delta\tau_{88,90})^*]\cdot|x_s t-\tau_3)|^{-2}$, where $\delta\tau_{82,90}$ denotes the time delay between the summing junction 82 and the gain adjustment estimator 90, $\delta\tau_{88,90}$ denotes the time delay between the correlator 88 and the gain error estimator 90, and $\delta\tau_{82,88}$ denotes the time delay between the summing junction 82 and the correlator 88. If the signals are properly aligned then $\tau+\delta\tau_{82,90}$ will be equal and $\delta_2+\delta\tau_{82,90}$ which, in turn equals $\tau_3$. In that case, the real component of the correlated error $Re\{\epsilon x_s^*\}$ will be a predictable $[-x_s(t-\tau-\delta\tau_{82,90})\cdot x_s(t-\tau-\delta\tau_{88,90})^*]\cdot|x_s(t-\tau_3)|^{-2} = -1$ and the imaginary component of the correlated error $Im\{\epsilon x_s^*\}$ will be a predictable 0. Since the set-point calibrator 186 receives the six boundary control signals from the gain adjustment estimator 90, it is possible to home in on the desired coordinates (−1,0). If other real or imaginary values are returned, then the calibrator 186 will issue appropriate first and second calibration signals to the calibration attenuator 182 and the calibration phase-shifter 184 until the proper values are returned.

FIG. 11

Figure 11:
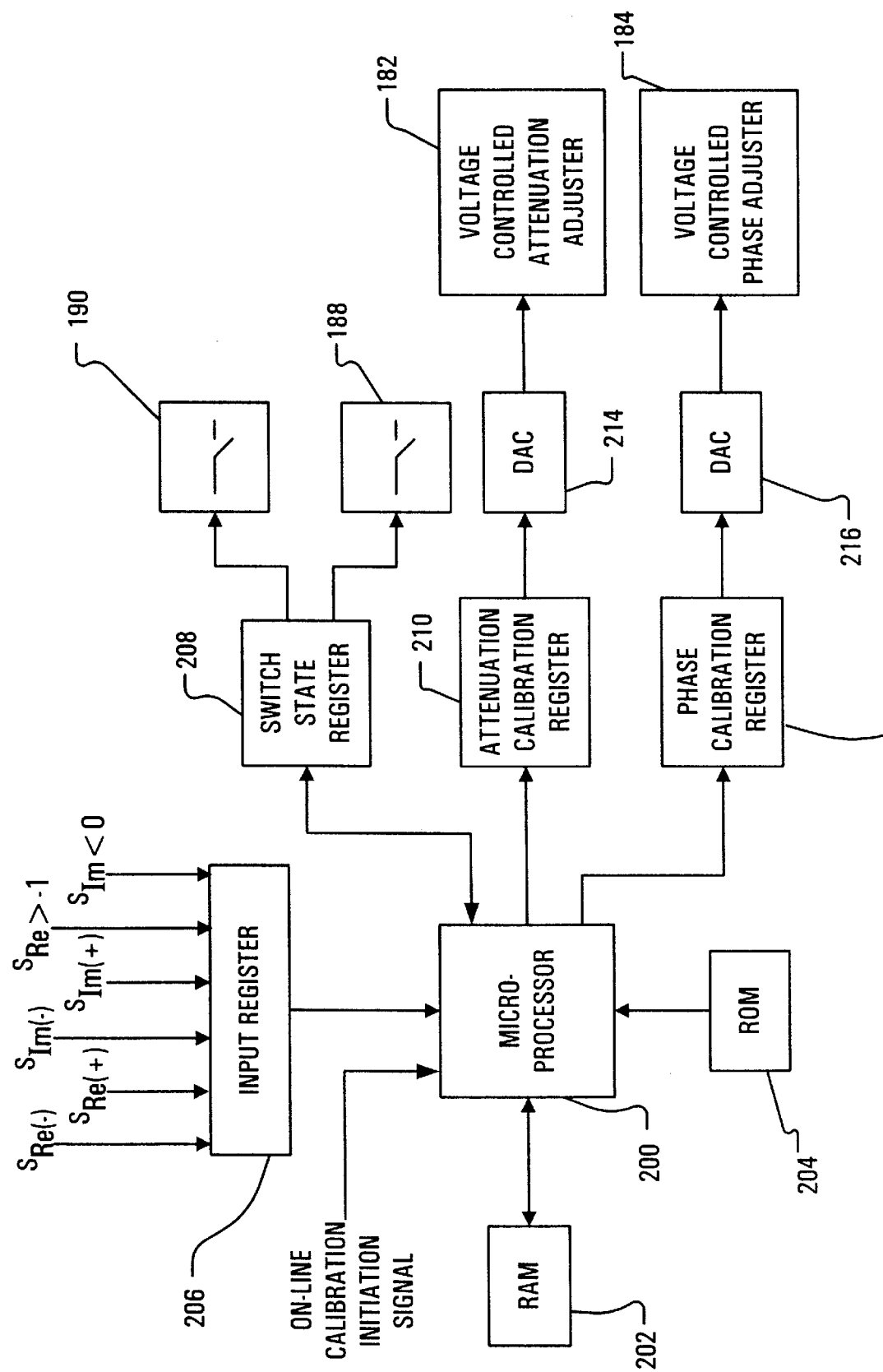
FIG. 11 is a block diagram of a microprocessor-based implementation of the on-line calibration module of FIG. 10.

With reference now to FIG. 11, the on-line calibration module 180 is described in even further detail.

The on-line calibration module 180 includes a microprocessor 200 having memory including Random Access Memory (RAM) 202 and Read Only Memory (ROM) 204, all connected to be controlled by and to exchange data with the microprocessor 200. The microprocessor 200 has conventional address and data buses.

The on-line calibration module 180 further includes an input register 206 connected to receive the six boundary control signals $S_{Re(-)}$, $S_{Re(+)}$, $S_{Im(-)}$, $S_{Im(+)}$, $S_{Im<0}$, $S_{Re>-1}$ and to make such signal values available to the microprocessor data bus when instructed by the microprocessor 200.

The microprocessor 200 is also connected to receive an on-line calibration initiation signal, which indicates that on-line calibration should be commenced at the next opportunity. The on-line calibration initiation signal is generated by a timer (not shown), by a sensor (not shown), or manually by a user (not shown). The on-line calibration initiation signal is connected to the microprocessor 200 as an interrupt line or a polled line.

The on-line calibration module 180 further includes a switch state register 208, an attenuation calibration register 210, and a phase calibration register 212. These registers are connected to store digital words generated by the microprocessor 200.

The switch state register 208 is connected to both the first switch 188 and the second switch 190. The states of the first and second switches 188, 190 are determined by the value of the digital word currently stored in the switch state register 208.

The attenuation calibration register 210 is connected through a first digital to analogue converter 214 to the voltage controlled attenuation adjuster 182. Similarly, the phase calibration register 212 is connected through a second digital to analogue converter 216 to the voltage controlled phase adjuster 184. The voltages controlling the voltage controlled attenuation adjuster 182 and the voltage controlled phase adjuster 184 are determined by the values of the digital words currently stored in the attenuation calibration register 210 and the phase calibration register 212 respectively.

FIG. 12

Figure 12:
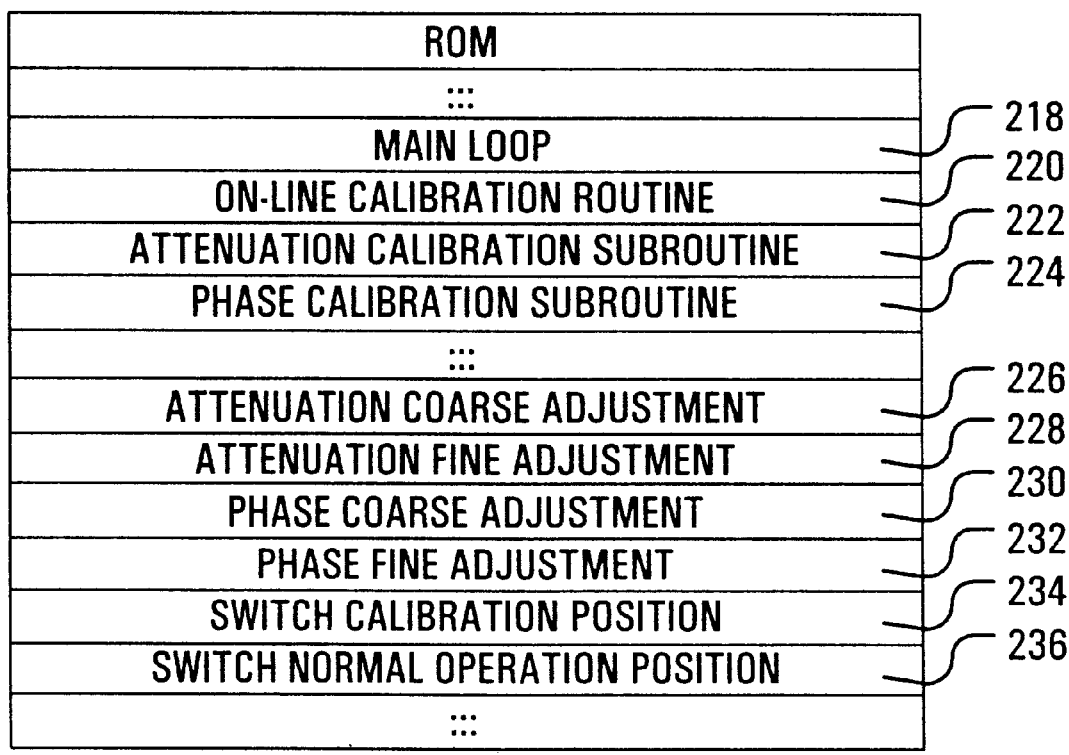
FIG. 12 is a tabular illustration of the Read Only Memory (ROM) structure of the on-line calibration module of FIG. 11.

Referring now to FIG. 12, the structure of the ROM 204 will now be described. The ROM 204 is programmed with codes representing instructions which direct the microprocessor 200 to perform various functions, including functions implementing: a Main Loop 218, an On-line Calibration Routine 220, an Attenuation Calibration Subroutine 222, and a Phase Calibration Subroutine 224.

The ROM 204 also stores a number of digital words used in the course of performing the above-mentioned functions. These words include an Attenuation Coarse Adjustment 226, an Attenuation Fine Adjustment 228, a Phase Coarse Adjustment 230, a Phase Fine Adjustment 232, a Switch Calibration Position 234, and a Switch Normal Operating Position 236.

FIG. 13

Figure 13:
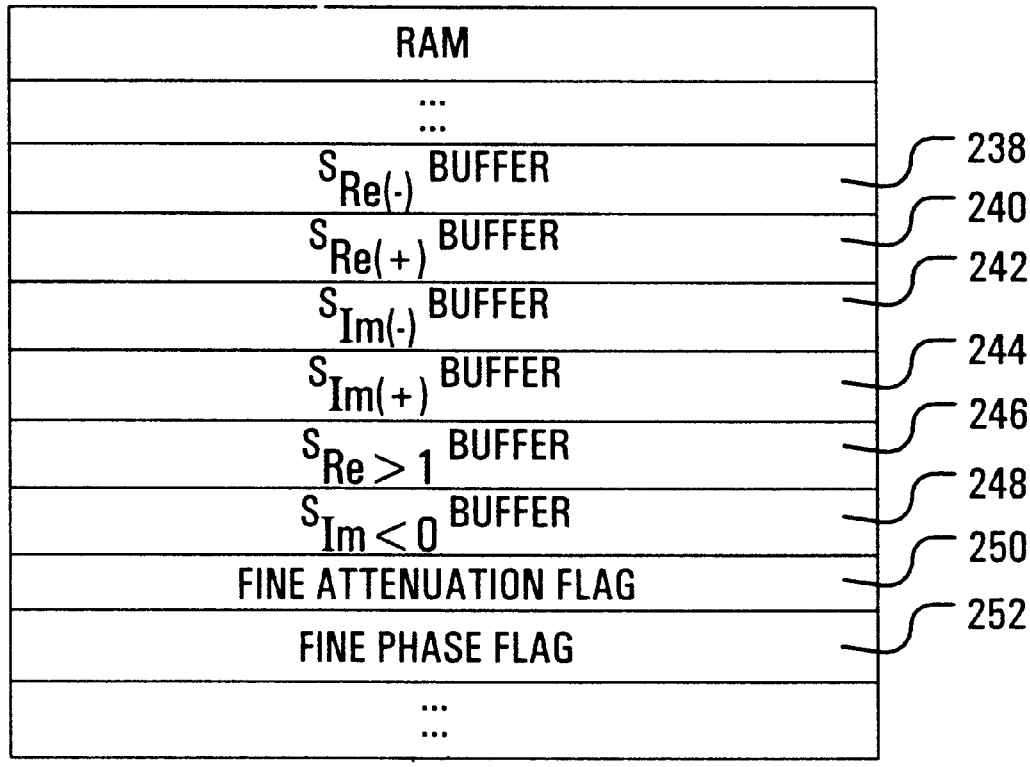
FIG. 13 is a tabular illustration of the Random Access Memory (RAM) structure of the on-line calibration module of FIG. 11.

With reference now to FIG. 13, the structure of the RAM 202 will now be described. The RAM 202 is configured to include a set of temporary storage buffers. These buffers include: an $S_{Re(-)}$ Buffer 238, an $S_{Re(+)}$ Buffer 240, $S_{Im(-)}$ Buffer 242, $S_{Im(+)}$ Buffer 244, $S_{Im<0}$ Buffer 246, $S_{Re>-1}$ Buffer 248, each of which is dedicated to storing a value of the similarly named boundary control signal $S_{Re(-)}$, $S_{Re(+)}$, $S_{Im(-)}$, $S_{Im(+)}$, $S_{Im<0}$, $S_{Re>-1}$.

The RAM 202 buffers also include an Attenuation Fine Region Buffer 250 and a Phase Fine Region Buffer 252 which are used to indicate whether the attenuation calibration and the phase calibration are respectively close to the calibrating standard value (−1,0).

FIG. 14

Figure 14:
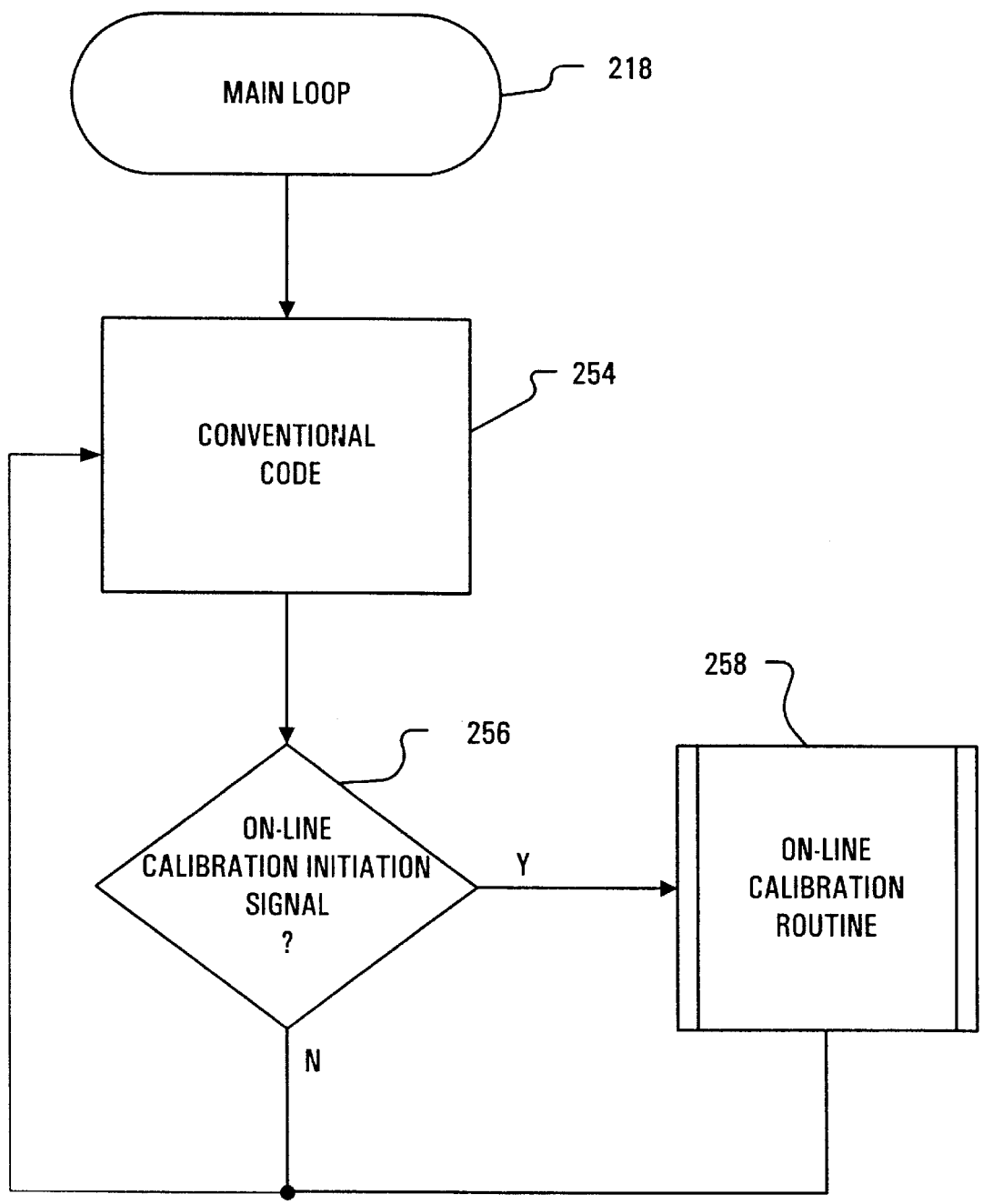
FIG. 14 is a flowchart of the Main Loop of the on-line calibration module of FIG. 11.

The operation of the on-line calibration module 180 will now be described with reference to FIG. 14, which is a flowchart of the Main Loop as stored in the ROM 204.

Block 254 provides conventional code for directing the microprocessor 200 to implement certain functionality, not part of the invention. Block 256 directs the microprocessor 200 to detect whether an On-line Calibration Initiation Signal has been issued. If not, then the block 256 directs the microprocessor 200 back to block 254 to continue executing conventional code. Alternatively, if an On-line Calibration Initiation Signal has been issued, then block 258 directs the microprocessor 200 to commence the On-line Calibration Routine 220.

FIG. 15

On-line Calibration Routine

Figure 15:
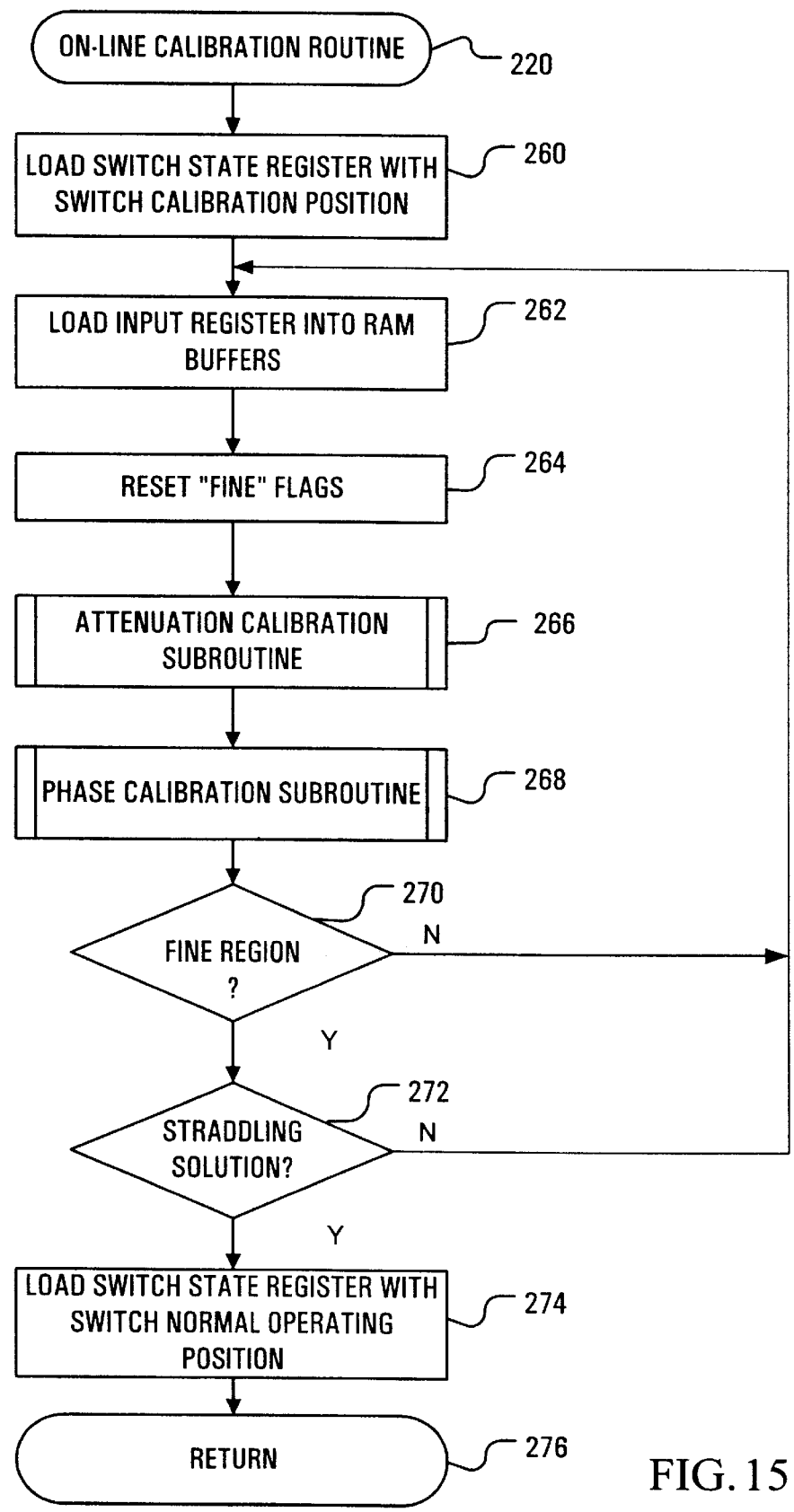
FIG. 15 is a flowchart of the On-line Calibration Routine of the on-line calibration module of FIG. 11.

With reference now to FIG. 15, the on-line calibration routine 220 is illustrated in greater detail. This routine oversees the on-line calibration process, isolating the amplifier 72 from the effects of the process and detecting when the process is complete.

Block 260 directs the microprocessor 200 to load the switch state register 208 with the switch calibration position word 234 from ROM 204 to cause the first and second switches 188, 190 to open and thereby isolate the amplifier 72 from the effects of the on-line calibration operation. Block 262 then directs the microprocessor 200 to load the current word from the input register 206 into the appropriate RAM 202 buffers such that the current value of each boundary control signal $S_{Re(-)}$, $S_{Re(+)}$, $S_{Im(-)}$, $S_{Im(+)}$, $S_{Im<0}$, $S_{Re>-1}$ is stored in its designated respective buffer 238, 240, 242, 244, 246, 248. Block 264 then directs the microprocessor 200 to reset the Fine Attenuation Flag 250 and the Fine Phase Flag 252.

Blocks 266 and 268 respectively direct the microprocessor 200 to call the Attenuation Calibration Subroutine 222 and the Phase Calibration Subroutine 224. These two subroutines, which will be discussed in greater detail with respect to FIGS. 16 and 17, respectively adjust the attenuation and phase calibration and respectively set the Fine Attenuation Flag 250 and the Fine Phase Flag 252 if the attenuation or the phase is close to its calibrating standard value (-1,0).

Block 270 directs the microprocessor 200 to determine whether the current overall calibration is close to its calibrating standard value (-1,0) by examining the values of the Fine Attenuation Flag 250 and the Fine Phase Flag. If neither flag is set, then block 270 directs the microprocessor 200 back to block 262 to commence another calibration cycle. Alternatively, if both flags are set, then the current calibration setting is considered close to the calibrating standard value (-1,0) and the microprocessor 200 is directed forward to block 272.

Block 272 directs the microprocessor 200 to determine whether the current overall calibration is so close to its calibrating standard value (-1,0) that calibration is beginning to straddle the ideal value. This determination is made with reference to the fifth and sixth boundary control signals $S_{Im<0}$ and $S_{Re>-1}$ which define between them four regions that intersect at the ideal calibration point (-1,0).

The technique embodied in block 272 is to compare the buffered values 248, 246 of the fifth and sixth boundary control signals $S_{Im<0}$ and $S_{Re>-1}$ with the more current values stored in the input register 206. If both buffered values 248, 246 are the complement of the values currently stored in the input register 206, then the calibration is considered to be straddling the ideal value (-1,0) and therefore the calibration process has been completed successfully.

If under the direction of block 272 the microprocessor 200 determines that the calibration process has not yet been completed successfully, then block 272 directs the microprocessor 200 back to block 262 to commence another calibration cycle.

If alternatively, under the direction of block 272 the microprocessor 200 determines that the calibration process has been completed successfully, then block 274 directs the microprocessor 200 to load the switch state register 208 with the switch normal operating position word 236 from ROM 204 to cause the first and second switches 188, 190 to close and reconnect the vector feedback linearization system back into the amplifier 72. Block 276 then directs the microprocessor 200 to return from the On-line Calibration Routine 220.

Figure 16:
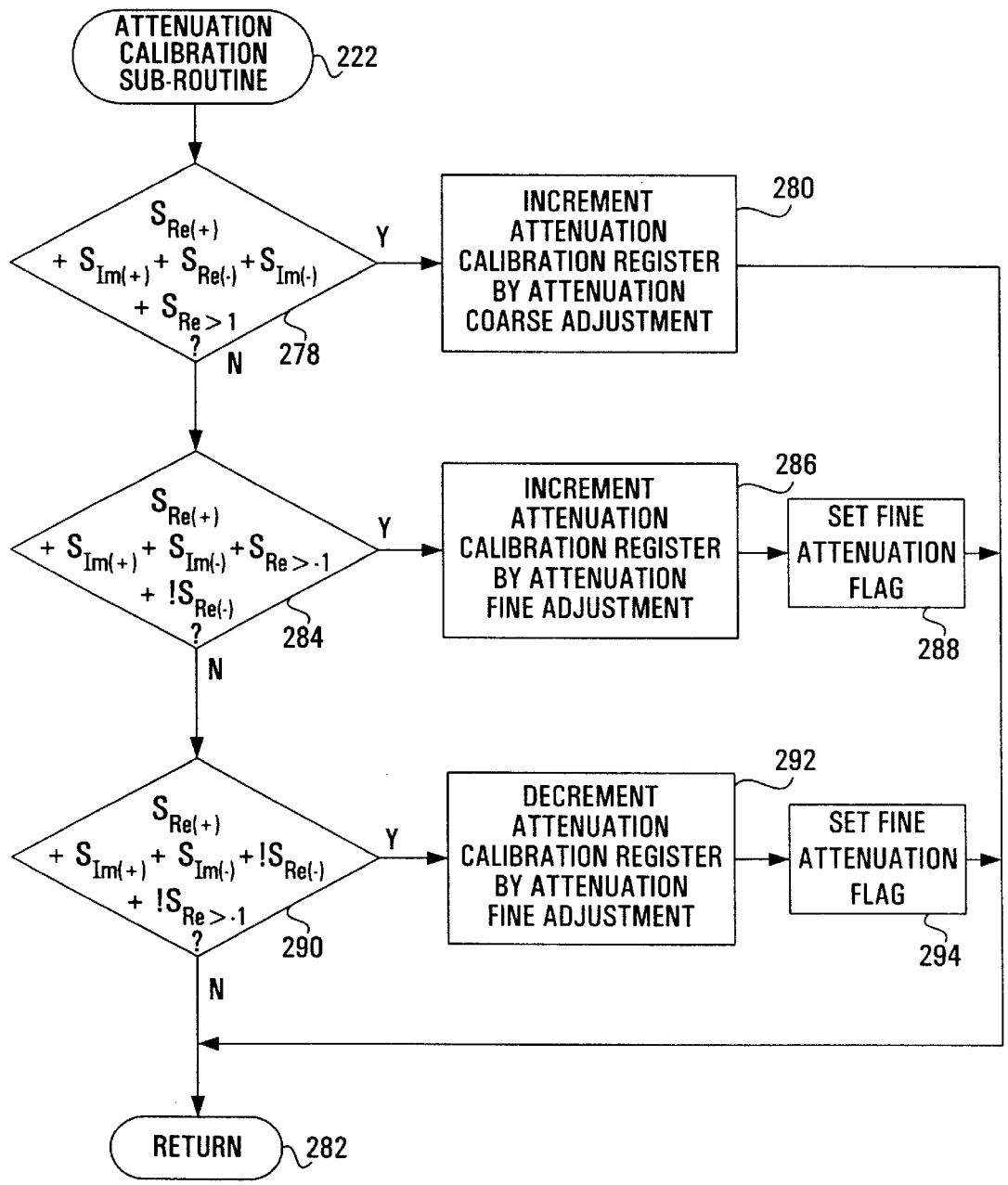
FIG. 16 is a flowchart of the Attenuation Calibration Subroutine of the on-line calibration module of FIG. 11.

FIG. 16
Attenuation Calibration Subroutine

With reference now to FIG. 16, the Attenuation Calibration Subroutine 222 will now be described in greater detail. Block 278 directs the microprocessor 200 to logically AND the $S_{Re(+)}$, $S_{Im(+)}$, $S_{Re(-)}$, $S_{Im(-)}$ and $S_{Re>-1}$ buffers 240, 244, 238, 242, 246. A true result indicates that the attenuation calibration is far from the ideal value (-1,0). If a true result is generated, then block 280 directs the microprocessor 200 to increment the attenuation calibration register 210 by the attenuation coarse adjustment 226 stored in ROM 204 and block 282 directs the microprocessor 200 to return from the Attenuation Calibration Subroutine 222.

Alternatively, if a false result is generated, then block 284 directs the microprocessor 200 to logically AND the contents of the $S_{Re(+)}$, $S_{Im(+)}$, $S_{Im(-)}$, $S_{Re>-1}$ buffers 240, 244, 242, 246 with the complement of the contents of the $S_{Re(-)}$ buffer 238. A true result indicates that the attenuation should be slightly increased. If a true result is generated then block 286 directs the microprocessor 200 to increment the attenuation calibration register 210 by the attenuation fine adjustment 228 stored in ROM 204, block 288 directs the microprocessor 200 to set the Fine Attenuation Flag 250, and block 282 directs the microprocessor 200 to return from the Attenuation Calibration Subroutine 222.

Alternatively, if a false result is generated, then block 290 directs the microprocessor 200 to logically AND the contents of the $S_{Re(+)}$, $S_{Im(+)}$, $S_{Im(-)}$, buffers 240, 244, 242, with the complement of the contents of the $S_{Re(-)}$, $S_{Re>-1}$ buffers 238 246. A true result indicates that the attenuation needs to be slightly decreased. If a true result is generated, then block 292 directs the microprocessor 200 to decrement the attenuation calibration register 210 by the attenuation fine adjustment 228 stored in ROM 204, block 294 directs the microprocessor 200 to set the Fine Attenuation Flag 250, and block 282 directs the microprocessor 200 to return from the Attenuation Calibration Subroutine 222.

Alternatively, if a false result is generated, then block 282 directs the microprocessor 200 to return from the Attenuation Calibration Subroutine 222.

Figure 17:
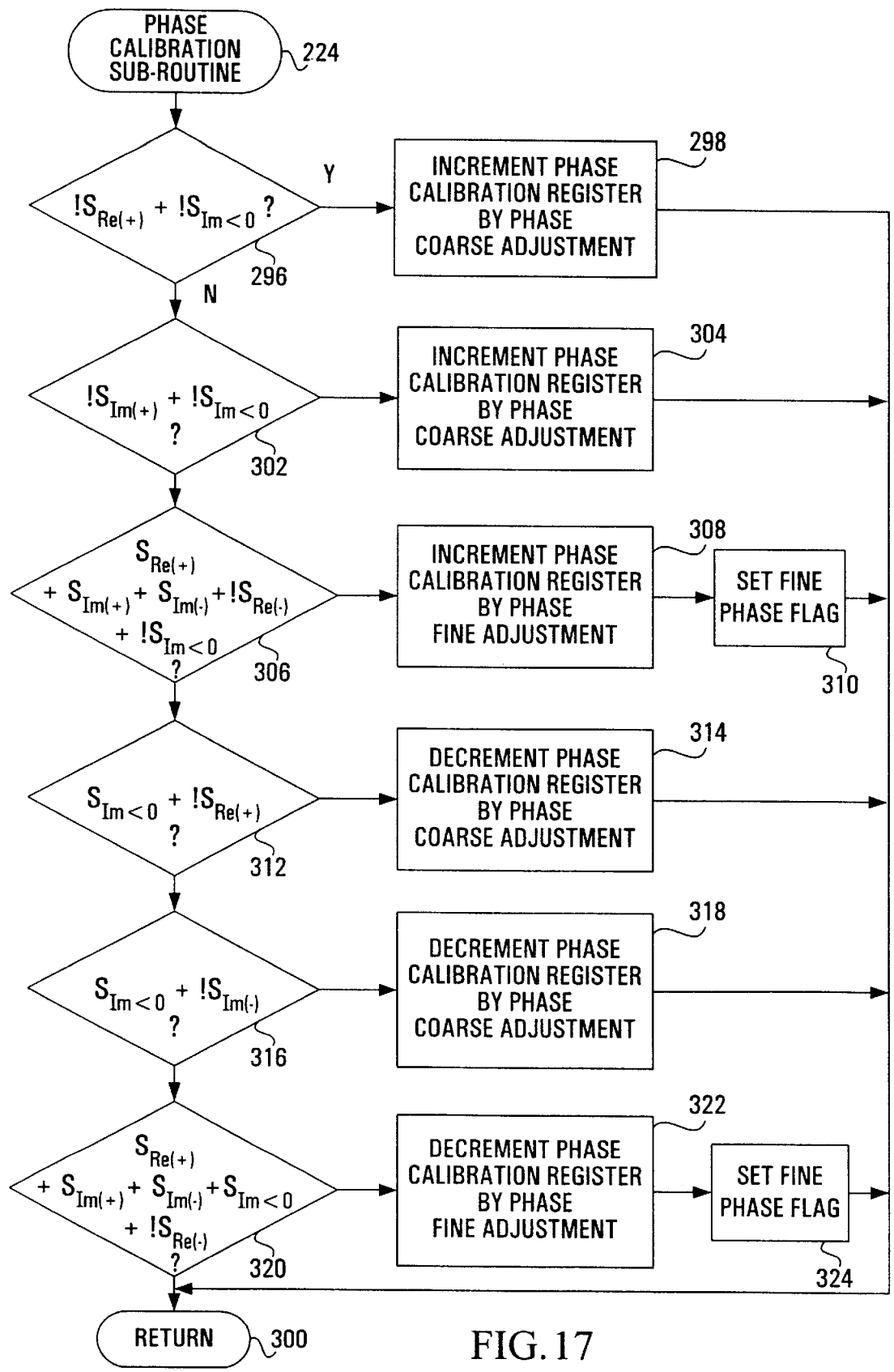
FIG. 17 is a flowchart of the Phase Calibration Subroutine of the on-line calibration module of FIG. 11.

FIG. 17
Phase Calibration Subroutine

With reference now to FIG. 17, the Phase Calibration Subroutine 224 will now be described in greater detail.

Block 296 directs the microprocessor 200 to logically AND the complement of the contents of the $S_{Re(+)}$ and $S_{Im<0}$ buffers 240, 248. A true result indicates that the phase calibration is far from the ideal value (-1,0). If a true result is generated, then block 298 directs the microprocessor 200 to increment the phase calibration register 212 by the phase coarse adjustment 230 stored in ROM 204 and block 300 directs the microprocessor 200 to return from the Phase Calibration Subroutine 224.

Alternatively, if a false result is generated, then block 302 directs the microprocessor 200 to logically AND the complement of the contents of the $S_{Im(+)}$ and $S_{Im<0}$ buffers 244, 248. A true result indicates that the phase calibration is far from the ideal value (-1,0). If a true result is generated, then block 304 directs the microprocessor 200 to increment the phase calibration register 212 by the phase coarse adjustment 230 stored in ROM 204 and block 300 directs the microprocessor 200 to return from the Phase Calibration Subroutine 224.

Alternatively, if a false result is generated, then block 306 directs the microprocessor 200 to logically AND the contents of the $S_{Re(+)}$, $S_{Im(+)}$, $S_{Im(-)}$, buffers 240, 244, 242 with the complement of the contents of the $S_{Re(-)}$ and $S_{Im<0}$ buffers 238, 248. A true result indicates that the phase needs to be slightly increased. If a true result is generated then block 308 directs the microprocessor 200 to increment the phase calibration register 212 by the phase fine adjustment 232 stored in ROM 204, block 310 directs the microprocessor 200 to set the Fine Phase Flag 252, and block 300 directs the microprocessor 200 to return from the Phase Calibration Subroutine 224.

Alternatively, if a false result is generated, then block 312 directs the microprocessor 200 to logically AND the $S_{Im<0}$ buffer 248 with the complement of the $S_{Re(+)}$ buffer 240. A true result indicates that the phase calibration is far from the ideal value (−1,0). If a true result is generated, then block 314 directs the microprocessor 200 to decrement the phase calibration register 212 by the phase coarse adjustment 230 stored in ROM 204 and block 300 directs the microprocessor 200 to return from the Phase Calibration Subroutine 224.

Alternatively, if a false result is generated, then block 316 directs the microprocessor 200 to logically AND the contents of the $S_{Im<0}$ buffer 248 with the complement of the contents of the $S_{Im(-)}$ buffer 242. A true result indicates that the phase calibration is far from the ideal value (−1,0). If a true result is generated, then block 318 directs the microprocessor 200 to decrement the phase calibration register 212 by the phase coarse adjustment 230 stored in ROM 204 and block 300 directs the microprocessor 200 to return from the Phase Calibration Subroutine 224.

Alternatively, if a false result is generated, then block 320 directs the microprocessor 200 to logically AND the contents of the $S_{Re(+)}$, $S_{Im(+)}$, $S_{Im(-)}$, $S_{Im<0}$, buffers 240, 244, 242, 248 with the complement of the contents of the $S_{Re(-)}$ buffer 238. A true result indicates that the phase needs to be slightly decreased. If a true result is generated then block 322 directs the microprocessor 200 to decrement the phase calibration register 212 by the phase fine adjustment 232 stored in ROM 204, block 324 directs the microprocessor 200 to set the Fine Phase Flag 252, and block 300 directs the microprocessor 200 to return from the Phase Calibration Subroutine 224.

Alternatively, if a false result is generated, then block 300 directs the microprocessor 200 to return from the Phase Calibration Subroutine 224.

While specific embodiments of the invention have been described and illustrated, such embodiments should be considered illustrative of the invention only and not as limiting the invention as construed in accordance with the accompanying claims.

What is claimed is:

1. An apparatus comprising:
    a) an amplifier having an input for receiving an amplifier input signal and an output for producing an amplifier output signal in response to said amplifier input signal, said amplifier including a vector modulator for amplifying said amplifier input signal, said vector modulator having a gain adjustment signal input for receiving a gain adjustment signal and having a gain adjustable in response to said gain adjustment signal;
    b) a gain error signal generator for producing a gain error signal dependent upon said amplifier input signal and said amplifier output signal, said gain error signal having real and imaginary components lying within pre-defined regions in a complex plane;
    c) a gain adjustment signal generator for generating said gain adjustment signal such that said gain adjustment signal is dependent upon which region in said complex plane said real and imaginary components lie in.

2. An apparatus as claimed in claim 1 wherein said pre-defined regions include first and second regions.

3. An apparatus as claimed in claim 2 wherein said first region is a small error region in which the magnitude of the error signal is relatively small and wherein said second region is a large error region in which the magnitude of the error signal is relatively large.

4. An apparatus as claimed in claim 3 wherein said gain adjustment signal generator includes a coarse gain adjustment estimator an a fine gain adjustment estimator for producing said gain error signal.

5. An apparatus as claimed in claim 4 wherein said coarse gain adjustment estimator is rendered operational in producing said gain error signal when the magnitude of said error signal is within said large error region and wherein said fine gain adjustment estimator is rendered operational in producing said gain error signal when the magnitude of said error signal is within said small error region.

6. An apparatus as claimed in claim 4 further including an integrator for integrating said gain error signal to produce an integrated scaled gain error estimate signal.

7. An apparatus as claimed in claim 3 further including an exponential amplifier for exponentially amplifying said integrated scaled gain error estimate signal.

8. An apparatus as claimed in claim 5 wherein said gain error signal generator includes first and second time shifters for producing first and second time shifted reference signals respectively.

9. An apparatus as claimed in claim 8 wherein said gain error signal generator includes a summing junction for summing said first time shifted reference signal with said output signal to produce an error signal.

10. An apparatus as claimed in claim 9 wherein said gain error signal generator includes a correlator for producing a correlated error signal from said error signal and said second time shifted reference signal.

11. An apparatus as claimed in claim 10 wherein said fine gain adjustment estimator is operable to produce a normalized correlated error signal produced by normalizing said correlated error signal with the power of said second time shifted reference signal.

12. An apparatus as claimed in claim 11 wherein said fine gain adjustment estimator produces said normalized correlated error signal such that said normalized correlated error signal is approximately equal to a gain error gradient of the error signal.

13. An apparatus as claimed in claim 11 wherein said coarse gain adjustment estimator determines the location of a normalized correlated error signal with respect to pre-defined boundaries and adjusts said normalized correlated error signal according to said location.

14. An apparatus as claimed in claim 9 wherein said gain adjustment signal generator includes an error signal path between said vector modulator and said summing junction, and an on-line calibrator for automatically compensating the second time shifted reference signal for asymmetries between the second time shifted reference signal and the error signal path, in response to said gain error signal.

15. An apparatus as claimed in claim 1 wherein said vector modulator is exponentially responsive to said gain adjustment signal.

16. A method of linearizing an amplifier having an input and an output, the method including the steps of:
    a) amplifying said amplifier input signal with a vector modulator having a gain adjustment signal input for receiving a gain adjustment signal and adjusting the gain of said vector modulator in response to a gain adjustment signal to produce an amplifier output signal at said amplifier output;

b) producing a gain error signal dependent upon said amplifier input signal and said amplifier output signal, said gain error signal having real and imaginary components lying within pre-defined regions in a complex plane;

c) generating said gain adjustment signal such that said gain adjustment signal is dependent upon which region in said complex plane said real and imaginary components of said error signal vector lie in.

17. A method as claimed in claim 16 further including the step of producing a gain error signal using a coarse gain adjustment estimator and a fine gain adjustment estimator.

18. A method as claimed in claim 17 further including the step of rendering said coarse gain adjustment estimator operational in producing said gain error signal when the magnitude of said error signal is within a large error region and further including the step of rendering operational said fine gain adjustment estimator in producing said gain error signal when the magnitude of said error signal is within a small error region.

19. A method as claimed in claim 17 further including the step of integrating said gain error signal to produce a scaled gain error estimate signal.

20. A method as claimed in claim 18 further including the step of exponentially amplifying said scaled gain error estimate signal.

21. A method as claimed in claim 18 further including the step of producing first and second time shifted reference signals respectively.

22. A method as claimed in claim 21 further including the step of summing said first time shifted reference signal with said output signal to produce an error signal.

23. A method as claimed in claim 22 further including the step of producing a correlated error signal from said error signal and said second time shifted reference signal.

24. A method as claimed in claim 23 further including the step of normalizing said correlated error signal with the power of said second time shifted reference signal to produce a normalized correlated error signal.

25. A method as claimed in claim 24 further including the step of producing said normalized correlated error signal such that said normalized correlated error signal is approximately equal to a gain error gradient of the error signal.

26. A method as claimed in claim 24 further including the step of determining the location of a normalized correlated error signal with respect to pre-defined boundaries and adjusting said normalized correlated error signal according to said location.

27. A method as claimed in claim 22 further including the step of automatically compensating the second time shifted reference signal for symmetries between the second time shifted reference signal and an error signal path, in response to said gain error signal.

28. A method as claimed in claim 16 further including the step of exponentially amplifying said amplifier input signal with said vector modulator.

* * * * *